(12) United States Patent
Chun et al.

(10) Patent No.: US 11,108,123 B2
(45) Date of Patent: Aug. 31, 2021

(54) TRIPLE-MODE DIELECTRIC RESONATOR FILTER, METHOD FOR MANUFACTURING THE SAME, AND BAND PASS FILTER USING DIELECTRIC RESONATOR AND NRN STUB

(71) Applicant: ACE TECHNOLOGIES CORPORATION, Incheon (KR)

(72) Inventors: Dong Wan Chun, Incheon (KR); Jae Kwang Yoon, Incheon (KR)

(73) Assignee: ACE TECHNOLOGIES CORPORATION, Incheon (KR)

( * ) Notice: Subject to any disclaimer, the term of this patent is extended or adjusted under 35 U.S.C. 154(b) by 30 days.

(21) Appl. No.: 16/613,586

(22) PCT Filed: May 15, 2018

(86) PCT No.: PCT/KR2018/005574
§ 371 (c)(1),
(2) Date: Nov. 14, 2019

(87) PCT Pub. No.: WO2018/212570
PCT Pub. Date: Nov. 22, 2018

(65) Prior Publication Data
US 2020/0083579 A1 Mar. 12, 2020

(30) Foreign Application Priority Data
May 17, 2017 (KR) .................. 10-2017-0061020
Sep. 1, 2017 (KR) .................. 10-2017-0111800

(51) Int. Cl.
*H01P 1/208* (2006.01)
*H01P 11/00* (2006.01)
(Continued)

(52) U.S. Cl.
CPC .......... *H01P 1/2086* (2013.01); *H01P 1/2084* (2013.01); *H01P 1/20309* (2013.01);
(Continued)

(58) Field of Classification Search
CPC .. H01P 1/20309; H01P 1/2084; H01P 1/2086; H01P 7/105; H01P 11/007; H01P 11/008
(Continued)

(56) References Cited

U.S. PATENT DOCUMENTS 4,757,289 A * 7/1988 Kosugi ................. H01P 1/2084
333/209
2005/0270120 A1* 12/2005 Guo ...................... H01P 1/2084
333/134
(Continued)

FOREIGN PATENT DOCUMENTS

JP 2004-186712 A 7/2004
JP 2004-349981 A 12/2004
(Continued)

OTHER PUBLICATIONS

Search Report, dated Aug. 24, 2018, for International Application No. PCT/KR2018/005574.
(Continued)

*Primary Examiner* — Rakesh B Patel
(74) *Attorney, Agent, or Firm* — LRK Patent Law Firm

(57) ABSTRACT

A triple-mode dielectric resonator filter includes: a dielectric resonator positioned in a cavity of a housing and formed perpendicular to a longitudinal direction of the housing; a dielectric support coupled to the dielectric resonator through a bonding process and mounted and fixed by a fixing screw passing through a screw fixing mounting hole in the cavity of the housing and fixed to support the dielectric resonator at a predetermined height; and compensation blocks formed to protrude at regular intervals on a side surface of the
(Continued)

dielectric resonator to allow the dielectric resonator to operate in three modes. A band pass filter composed of a dielectric resonator and an NRN stub achieves an improved insertion loss, high compression properties and a stable structure compared to a typical band pass filter using an NRN stub.

22 Claims, 19 Drawing Sheets

(51) Int. Cl.
 *H01P 7/10* (2006.01)
 *H01P 1/203* (2006.01)
(52) U.S. Cl.
 CPC ............ *H01P 7/105* (2013.01); *H01P 11/007* (2013.01); *H01P 11/008* (2013.01)
(58) Field of Classification Search
 USPC .......................................... 333/202, 208–212
 See application file for complete search history.

(56) References Cited

U.S. PATENT DOCUMENTS

2016/0301378 A1* 10/2016 Wang .................... H01P 1/2138
2017/0263996 A1* 9/2017 Karhu ..................... H01P 7/105

FOREIGN PATENT DOCUMENTS

| KR | 10-1999-0047206 A | 7/1999 |
| KR | 10-2006-0032576 A | 4/2006 |
| KR | 10-1261908 B1 | 5/2013 |
| KR | 10-1357027 B1 | 2/2014 |
| KR | 10-1420044 B1 | 7/2014 |

OTHER PUBLICATIONS

Written Opinion, dated Aug. 24, 2018, for International Application No. PCT/KR2018/005574.

\* cited by examiner

| Eigenmode | Frequency (GHz) | Q |
|---|---|---|
| Mode 1 | 2.30127 +j 6.90590e-05 | 16661.6 |
| Mode 2 | 2.30129 +j 6.90644e-05 | 16660.4 |
| Mode 3 | 2.30144 +j 6.63959e-05 | 17331.2 |

(e)

Band Pass filter

TRIPLE-MODE DIELECTRIC RESONATOR FILTER, METHOD FOR MANUFACTURING THE SAME, AND BAND PASS FILTER USING DIELECTRIC RESONATOR AND NRN STUB

CROSS-REFERENCE TO RELATED APPLICATIONS

The present application is a U.S. National Phase entry from International Application No. PCT/KR2018/005574, filed May 15, 2018, which claims priority to Korean Patent Application Nos. 10-2017-0061020, filed May 17, 2017, and 10-2017-0111800, filed Sep. 1, 2017, the disclosures of which are incorporated by reference herein in their entirety.

BACKGROUND

1. Field of the Invention

The present invention relates to a triple-mode dielectric resonator filter, a method for manufacturing the same, and a band pass filter using a dielectric resonator and an NRN stub, and more specifically, to a triple-mode dielectric resonator filter, a method for manufacturing the same, and a band pass filter having a coupling stub between a dielectric resonator and an NRN stub, the triple-mode dielectric resonator filter capable of implementing a dielectric resonator operating in three modes while implementing a mounting hole for a screw in the center of the dielectric resonator by forming a compensation block in the dielectric resonator embedded in a housing constituting the filter.

2. Description of Related Art

As communication services have evolved in recent years, it is necessary to increase the transmission speed of data and the bandwidth of a system as well as to improve reception sensitivity and minimize interference caused by carriers of other communication systems. To this end, a filter having low insertion loss and high rejection properties is essential.

Under the circumstances, the demand for a dielectric resonator filter is on the rise day by day since the dielectric resonator filter is capable of implementing low insertion loss and high rejection properties. However, even though such a dielectric resonator filter may implement high performance, the dielectric resonator is large in size and heavy in weight due to the nature thereof, and thus, is disadvantageous.

In addition, in order to prevent transmission power loss and reception sensitivity deterioration due to a feeder cable in a base station transceiver subsystem (BTS) system, a radio frequency unit is installed by being directly connected to an antenna of the BTS system and also installed on the top of the tower of the BTS system. Therefore, the miniaturization and weight reduction of the radio frequency unit are required, and thus, the miniaturization and weight reduction of a filter using a dielectric resonator, which occupies the largest proportion in weight and size, is required. Studies have been actively conducted on the issue.

Such miniaturization and weight reduction of a dielectric resonator filter may be achieved by a multi-mode dielectric resonator filter capable of forming a plurality of resonance modes using a single dielectric resonator, and the multi-mode dielectric resonator filter operated in the plurality of resonance modes implemented using the single dielectric resonator, unlike a single-mode filter operating in a single resonance mode with a typical single resonator, may form multiple resonance modes by one single dielectric resonator. Therefore, compared to the single-mode filter, the multi-mode dielectric resonator filter may be made smaller in size and lighter in weight, and may exhibit high performance so that interests in the multi-mode dielectric resonator filter capable of exhibiting high performance are gradually increasing.

However, since there are a plurality of resonance modes in a single resonator in the multi-mode dielectric resonator filter according to the prior art, interference between resonance modes is inevitable. A multi-mode filter which may be implemented to the maximum in terms of mass production to prevent interference between the resonance modes caused by the properties of a resonator filter is a triple-mode dielectric resonator filter having up to three resonant modes of TE01δx, TE01δy, and TE01δz, and in order to adjust the properties such as a center frequency and a coupling coefficient, tuning is essential.

In general, a dielectric resonator mounted inside the triple-mode dielectric resonator filter may be manufactured in the shape of sphere, cube, and cylinder, and a dielectric resonator including most TE01δ single modes needs to be floated inside a cavity of a coaxial cable to implement the properties of the resonator, and thus, may be seated on a dielectric supporter made of alumina having a low dielectric constant.

Here, the dielectric support made of alumina and the dielectric resonator may be coupled to each other by bonding (epoxy), and then may be mounted to a housing constituting a resonator filter by a fixing screw as shown in the view.

At this time, a dielectric support and a dielectric resonator according to the prior art have a mounting hole for mounting a fixing screw formed in the center each thereof. In the case of a dielectric resonator operating in three modes, unlike a dielectric resonator operating in a single mode, when a hole for mounting a fixing screw is formed in the center thereof, resonant frequencies of TE01δx mode, TE01δy mode, and TE01δz mode are separated, so that implementing a dielectric resonator filter becomes problematic.

In order to solve the above problem, a dielectric resonator filter according to the prior art mounts a dielectric support of an alumina material on a housing, and then bonds a dielectric resonator operating in three modes without a hole for mounting a fixing screw to the dielectric support, and couples the dielectric support and the dielectric resonator through a thermal-curing process. However, when such a thermal-curing process is performed, due to the problem in which a plated portion of a housing constituting a resonator filter is discolored or a painted surface thereof is destroyed, it is not possible to apply heat to a desired temperature so that only a low-temperature curing adhesive having a low rigidity is used. As a result, there is a problem in that the dielectric resonator filter is venerable to external vibration or impact.

FIG. 1 is a view showing a schematic configuration of a single-mode dielectric resonator filter having only TE01δ according to the prior art, and FIG. 2 is a view showing a schematic configuration of a triple-mode dielectric resonator filter of TE01δx, TE01δy, and TE01δz according to the prior art.

As illustrated in the views, the single-mode dielectric resonator filter of FIG. 1 has a dielectric support 4 of an alumina material and a screw hole 3-1 for mounting a fixing screw 2 in the center of a dielectric resonator 3 operating in a single mode.

In the single-mode dielectric resonator filter, as described above, an epoxy adhesive was first applied on a coupling surface of a dielectric resonator and a dielectric support to couple the dielectric resonator and the dielectric support, and after the coupling, heat treatment for curing the epoxy adhesive was performed at a predetermined temperature. Thereafter, the dielectric resonator having the dielectric support attached thereto was stably mounted on a housing constituting a dielectric filter through a hole for mounting a fixing screw.

As described above, the triple-mode dielectric resonator filter of FIG. 2 does not have a hole for mounting a fixing screw in the center of the dielectric resonator 3. Therefore, the dielectric support 4 of an alumina material may be mounted on a housing with the fixing screw 2, first. Thereafter, an adhesive is applied on a coupling surface of the dielectric resonator and the dielectric support and a heat treatment process for thermal curing may be performed.

The triple-mode dielectric resonator filter according to the prior art may use only an adhesive which is cured at a low temperature to prevent the discoloration of a housing plated with silver or copper and the surface defect of a housing painted during the heat treatment process. Since the adhesive has a lower rigidity than a high-temperature curing adhesive used in a single mode, a high-weight dielectric resonator may be separated during external vibration or impact, and thus, there is difficulty in implementing a stable coupling structure.

Therefore, there is an urgent need for a practical and applicable technology for a triple-mode dielectric resonator filter capable of implementing a triple-mode resonator while simultaneously implementing a mounting hole for a screw in the center of a dielectric resonator embedded in a housing constituting the dielectric resonator filter.

Meanwhile, FIG. 3 is an equivalent circuit diagram of a band rejection filter (BRF) using a triple-mode dielectric resonator which is the prior art. As illustrated, the band rejection filter using a triple-more dielectric resonator includes a resonator circuit 30 of a dielectric resonator, a λ/4 transmission line 40, and an inductance 45 as a coupling means between the resonator circuit 30 and the λ/4 transmission line 40. Since a coupling means between the dielectric resonator and an adjacent resonator is not required, there are advantages in that each mode may be independently implemented and the position of a transmission zero may be adjusted using the dielectric resonator.

Here, the transmission zero refers to a zero frequency at which a signal is not transmitted, that is, a point on a complex frequency plane in which the transmission amount of the signal becomes zero. At this time, the attenuation of the signal becomes infinite, so that the transmission zero is also referred to as an 'attenuation pole.'

FIG. 4 is a view showing S-parameter properties for the band rejection filter of FIG. 3. As illustrated, a suppression band is formed by a first transmission zero to a third transmission zero, and the suppression band is a point at which the attenuation is about −14 dB, which is about 7 MHz. In the case of the band rejection filter, only the transmission zero may be adjusted. The number of transmission zeros is determined according to the number of resonators, and there is a disadvantage in that there is no reflection zero. That is, there is a disadvantage in that the suppression band bandwidth of the band rejection filter is determined by the transmission zero point according to the number of resonators.

Meanwhile, when a band pass filter (BPF) is implemented using a triple-mode dielectric resonator, in order to obtain optimal properties, the same number of transmission zeros and reflection zeros should be formed in the S-parameter properties diagram. However, since the number of transmission zeros according to the number of dielectric resonators is approximately half of the number of resonators, in order to obtain the properties of high suppression to obtain a desired transmission zero, the number of dielectric resonators is increased and an additional coupling means for implementing coupling between resonators are required, so that there is a disadvantage in that there is a limit to the implementation.

In order to solve the above problem, a method for implementing a band pass filter (BPF) using a non-resonating node (NRN) capable of obtaining the same number of transmission zeros and reflection zeros as the number of resonators has been introduced and used. However, due to the limitations of specific implementation methods, research on the implementation method using an NRN is urgently needed.

SUMMARY OF THE INVENTION

Technical Problem

An aspect of the present invention provides a triple-mode dielectric resonator filter capable of implementing a resonator operating in three modes while implementing a mounting hole for a screw in the center of the dielectric resonator by forming a compensation block in the dielectric resonator embedded in a housing constituting the filter.

Another aspect of the present invention provides a band pass filter capable of adjusting the height of a dielectric resonator and the horizontal length of a compensation block by a band pass filter including the dielectric resonator and an NRN stub to set resonance frequencies operating in three modes.

Yet another aspect of the present invention provides a band pass filter composed of a dielectric resonator and an NRN stub for securing an improved insertion loss and a stable structure compared to a band pass filter using a typical NRN stub, and also having improved high rejection properties compared to a band pass filter and a band rejection filter using a typical triple-mode dielectric resonator.

Technical Solution

A triple-mode dielectric resonator filter according to an embodiment of the present invention includes a housing having one side thereof open while having a cavity thereinside, a cover coupled to one side of the housing to seal the cavity, a dielectric resonator having a screw mounting hole at the center thereof, positioned in the cavity of the housing, and formed perpendicular to a longitudinal direction of the housing, a dielectric support coupled to the dielectric resonator through a thermosetting bonding process and mounted by a fixing screw passing through the screw mounting hole inside the cavity of the housing and fixed to support the dielectric resonator at a predetermined height, and a plurality of compensation blocks formed to protrude at regular intervals on a side surface of the dielectric resonator to allow the dielectric resonator to operate in three modes.

The plurality of compensation blocks for allowing the dielectric resonator to operate in three modes may be formed to be paired with each other such that a horizontal cross-section of the dielectric resonator has a symmetric shape.

The plurality of compensation blocks may be configured such that compensation blocks adjacent to each other on a side surface of the dielectric resonator are smoothly connected to a curved surface having a cross-section in an arc shape.

The triple-mode dielectric resonator filter according to an embodiment of the present invention may adjust the height of a dielectric resonator and the length between a plurality of compensation blocks facing each other based on the horizontal cross-section of the dielectric resonator to an optimized state to set resonant frequencies operating in three modes.

In the triple-mode dielectric resonator filter according to an embodiment of the present invention, when the height of a dielectric resonator is relatively greater than the length between a plurality of compensation blocks facing each other based on the horizontal cross-section of the dielectric resonator, resonant frequencies of TE01δx and TE01δy modes may be higher than a resonant frequency of TE01δz mode in resonant frequencies operating in three modes.

In the triple-mode dielectric resonator filter according to an embodiment of the present invention, when the height of the dielectric resonator is relatively less than the length between the plurality of compensation blocks facing each other based on the horizontal cross-section of the dielectric resonator, resonant frequencies of TE01δx and TE01δy modes may be lower than a resonant frequency of TE01δz mode in resonant frequencies operating in three modes.

In the triple-mode dielectric resonator filter according to an embodiment of the present invention, when the height of a dielectric resonator is the same as the length between a plurality of compensation blocks facing each other based on the horizontal cross-section of the dielectric resonator, resonant frequencies of TE01δx and TE01δy modes may be similar to a resonant frequency of TE01δz mode in resonant frequencies operating in three modes.

In the triple-mode dielectric resonator filter according to an embodiment of the present invention, the dielectric support coupled to the dielectric resonator by a thermosetting bonding process may be coupled with a bonding material of an epoxy material.

A method for manufacturing a triple-mode dielectric resonator filter according to another embodiment of the present invention may include a first step of providing a mounting hole for fixing a screw in the center of a dielectric resonator of a dielectric material which operates in three modes of TE01δx, TE01δy, and TE01δz, and forming compensation blocks to protrude at regular intervals on a side surface of the dielectric resonator, a second step of bonding and coupling a dielectric support of an alumina material which supports the dielectric resonator to the dielectric resonator through an epoxy bonding process, and then performing a heat treatment process through a thermal-curing process, and a third step of fixing a dielectric support to which the dielectric resonator is coupled through a thermal-curing process to a housing using a screw inserted through the mounting hole for fixing a screw in the housing constituting the triple-mode dielectric resonator filter.

The method for manufacturing a triple-mode dielectric resonator filter according to an embodiment of the present invention may adjust the height of a dielectric resonator and the length between a plurality of compensation blocks facing each other based on the horizontal cross-section of the dielectric resonator to an optimized state.

A band pass filter using a dielectric resonator and an NRN stub according to yet another embodiment of the present invention includes a housing and a cover, wherein the housing is formed to have one side thereof open while having a cavity thereinside and the cover is coupled to one side of the housing to seal the cavity, a dielectric resonator formed in a central portion of the cavity inside the housing and operating at resonant frequencies of three modes of TE01δx, TE01δy, and TE01δz, a dielectric support which supports the dielectric resonator, a λ/4 transmission line formed along the outside of the cavity while surrounding the dielectric resonator, a non-resonating node (NRN) stub connected to the λ/4 transmission line and capable of obtaining the same number of transmission zeros and reflection zeros as the number of modes of the dielectric resonator, and a coupling stub connected to the λ/4 transmission line and formed around the dielectric resonator to mutually couple the dielectric resonator and the NRN stub.

A band pass filter using a dielectric resonator and an NRN stub according to yet another embodiment of the present invention includes a housing and a cover, wherein the housing is formed to have one side thereof open while having a cavity thereinside and the cover is coupled to one side of the housing to seal the cavity, a dielectric resonator having a compensation block and formed in a central portion of the cavity inside the housing and operating at resonant frequencies of three modes of TE01δx, TE01δy, and TE01δz, a dielectric support which supports the dielectric resonator having a compensation block, a λ/4 transmission line formed along the outside of the cavity while surrounding the dielectric resonator having a compensation block, a non-resonating node (NRN) stub connected to the λ/4 transmission line and capable of obtaining the same number of transmission zeros and reflection zeros as the number of modes of the dielectric resonator, and a coupling stub connected to the λ/4 transmission line and formed around the dielectric resonator to mutually couple the dielectric resonator and the NRN stub.

According to the present invention, the dielectric resonator may be provided with a mounting hole for a screw in the center thereof, positioned in the center of the cavity of the housing, and formed perpendicular to the length direction of the housing.

According to the present invention, the NRN stub is a plurality of TE01δx, TE01δy, TE01δz mode NRN stubs, which may be formed along the outside of the transmission line.

According to the present invention, the NRN stub is an inductive NRN stub acting as an inductor, and using the length and width of the inductive NRN stub, the reactance value or the inductance value of the stub may be adjusted.

According to the present invention, the NRN stub formed in each of TE01δx, TE01δy, and TE01δz modes may have an end thereof formed as a short circuit line.

According to the present invention, the coupling stub may be formed in each of TE01δx, TE01δy, and TE01δz modes which respectively correspond to the dielectric resonator operating in TE01δx, TE01δy, and TE01δz modes and the NRN stub formed in each of TE01δx, TE01δy, and TE01δz modes.

According to the present invention, the length of the coupling stub disposed between the dielectric resonator and the NRN stub in each of TE01δx, TE01δy, and TE01δz modes may be increased to widen the intervals between the reflection zeros, thereby forming a wide passband.

According to the present invention, each of the coupling stubs in each of TE01δx, TE01δy, and TE01δz formed corresponding to the plurality of NRN stubs in each of TE01δx, TE01δy, and TE01δz modes may have an end thereof formed as an open line.

According to the present invention, the coupling stubs in each of TE01δx, TE01δy, and TE01δz may be arranged to have the same field orientation and a perpendicular coupling structure to minimize parasitic coupling occurring between each mode and each coupling structure.

According to the present invention, the coupling stub of TE01δx mode and the coupling stub of TE01δy mode may be arranged to be perpendicular to each other, and the coupling stub of TE01δz mode may be disposed to be mutually perpendicular to the coupling stub of TE01δx and the coupling stub of TE01δy to minimize the parasite coupling structure with the resonator in TE01δx and TE01δy modes.

According to the present invention, the length of the coupling stub for the TE01δx mode and the length of the coupling stub for the TE01δy mode may be varied in a z-axis direction, and the length of the coupling stub of TE01δz mode may be varied along the direction around the circumference of the dielectric resonator.

A band pass filter using a dielectric resonator and an NRN stub according to yet another embodiment of the present invention includes a housing and a cover, wherein the housing is formed to have one side thereof open while having a cavity thereinside and the cover is coupled to one side of the housing to seal the cavity, a dielectric resonator formed in a central portion of the cavity inside the housing and operating at resonant frequencies of three modes of TE01δx, TE01δy, and TE01δz, wherein the dielectric resonator is formed in plurality and each thereof has a compensation block, a dielectric support which supports the dielectric resonator having a compensation block, a λ/4 transmission line formed along the outside of the cavity while surrounding the dielectric resonator having a plurality of compensation blocks, a non-resonating node (NRN) stub connected to the λ/4 transmission line and capable of obtaining the same number of transmission zeros and reflection zeros as the number of modes of the dielectric resonator having a plurality of compensation blocks, and a coupling stub connected to the λ/4 transmission line and formed around the dielectric resonator to mutually couple the dielectric resonator and the NRN stub.

Advantageous Effects

As described above, the present invention has an effect of providing a triple-mode dielectric resonator filter capable of implementing a resonator operating in three modes while implementing a mounting hole for a screw in the center of the dielectric resonator by forming a compensation block in the dielectric resonator embedded in a housing constituting the filter.

In addition, a band pass filter composed of a dielectric resonator and an NRN stub of the present invention has an effect of securing an improved insertion loss and a stable structure compared to a band pass filter using a typical NRN stub, and at the same time, being reduced in size by at least 30% and having improved high rejection properties compared to a band pass filter and a band rejection filter using a typical triple-mode dielectric resonator.

Another aspect of the present invention provides a band pass filter capable of adjusting the height of a dielectric resonator and the horizontal length of a compensation block by a band pass filter including the dielectric resonator and an NRN stub to set resonance frequencies operating in three modes.

BRIEF DESCRIPTION OF THE DRAWINGS

FIG. 14b is a view showing a change in reactance values of an inductive NRN stub according to the length of the inductive NRN stub in the band pass filter according to FIG. 14a.

FIG. 16 is a view showing S-parameter properties for the structure of the band pass filter according to FIG. 13a.

Figure 1:
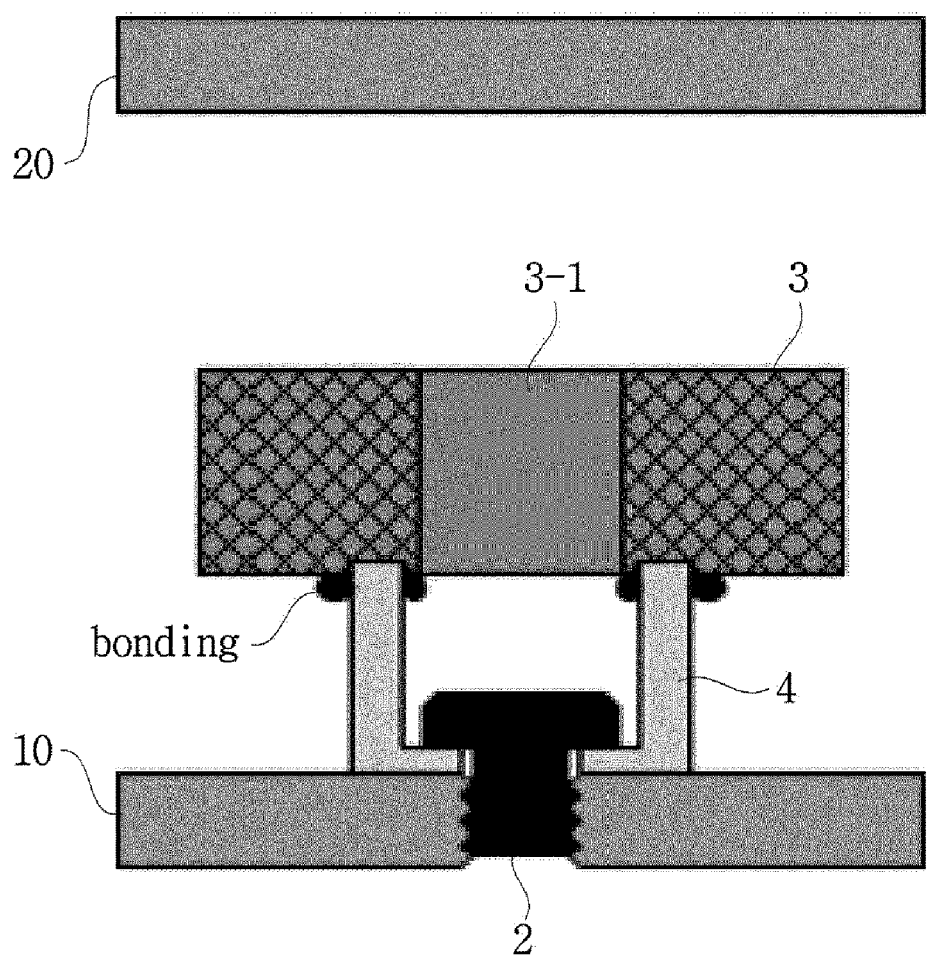
FIG. 1 is a view showing a schematic configuration of a single-mode dielectric resonator filter having only a TE01δ mode according to the prior art.
Figure 2:
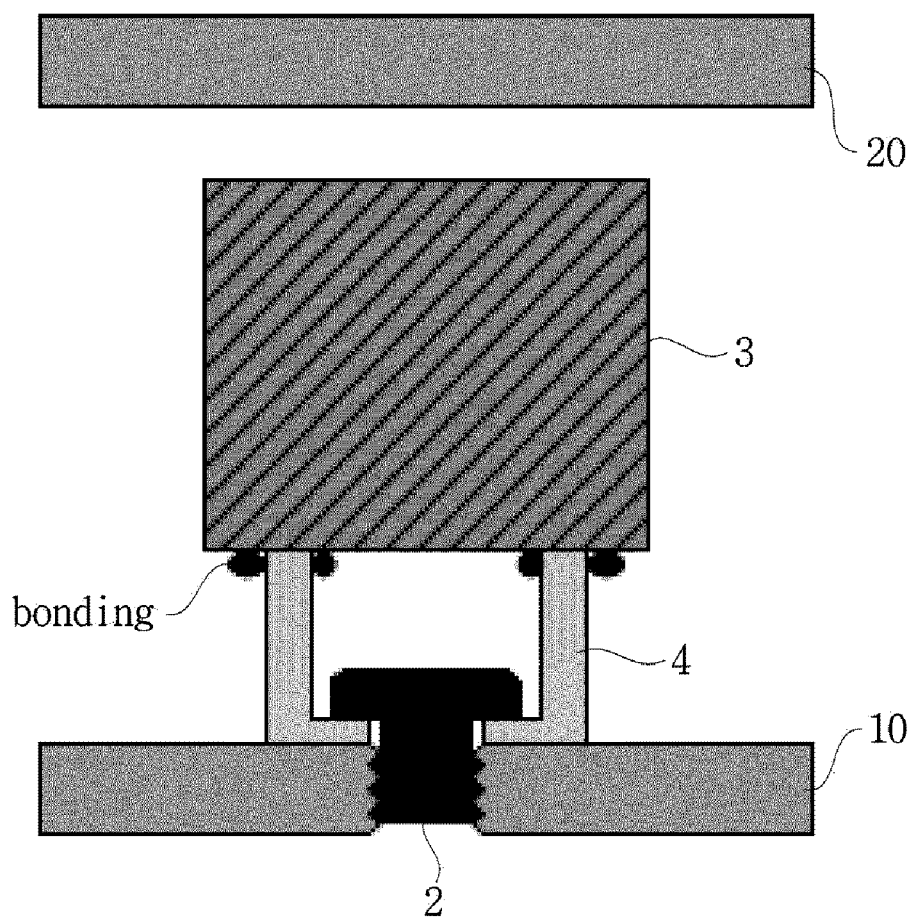
FIG. 2 is a view showing a schematic configuration of a dielectric resonator filter of TE01δx, TE01δy, and TE01δz modes according to the prior art.

Best Mode For Carrying Out the Invention

Since the description of the present invention is merely exemplary for structural and functional description, the scope of the present invention is not to be construed as limited by the embodiments set forth herein. That is, since the embodiments may be variously modified and may have a variety of forms, the scope of the present invention is to be understood as including equivalents capable of implementing the technical idea.

Meanwhile, the meaning of the terms described in the present invention should be understood as follows.

The terms "first," "second," and the like are intended to distinguish one element from another element, and the scope of the present invention should not be limited by these terms. For example, a first element could be termed a second element, and similarly, a second element could be termed a first element.

When an element is referred to as being "connected" to another element, the element may be directly connected to the other element. However, it should be understood that there may be other elements therebetween. On the other hand, when an element is referred to as being "directly connected" to another component, it should be understood that there is no other element therebetween. Meanwhile, other expressions describing the relationship between elements, such as "between~," "immediately between~," "neighboring to~" and "directly neighboring to~", should be interpreted as the above as well.

The terms of a singular form may include the terms of a plural form unless the context clearly indicates otherwise. The terms "comprise", or "have" are intended to specify the presence of stated features, numbers, steps, operations, elements, components, or combinations thereof, and it should be understood that it does not exclude in advance the possibility of the presence or addition of one or more other features, numbers, steps, operations, elements, components, or combinations thereof.

An identification code (for example, a, b, c, etc.) in each step is used for convenience of explanation, and the identification code is not to describe the order of each step. Each step may be performed in an order different from the order specified herein unless the context explicitly dictates a specific order. That is, each step may be performed in the same order as specified, may be performed substantially simultaneously, or may be performed in the reverse order.

All terms used herein have the same meaning as those commonly understood by those with ordinary skill in the art to which the present invention belongs, unless otherwise defined. Terms that are defined in a dictionary commonly used should be construed as consistent with the meaning in the context of the related art, and should not be construed as having an ideal or overly formal meaning unless explicitly defined in the present invention.

The present invention relates to a triple-mode dielectric resonator filter operating at a triple-mode resonance frequency of TE01δx, TE01δy, and TE01δz, a method for manufacturing the same, and a band pass filter using a dielectric resonator and an NRN.

Hereinafter, preferred embodiments of the present invention will be described in detail with reference to the accompanying drawings.

Figure 5:
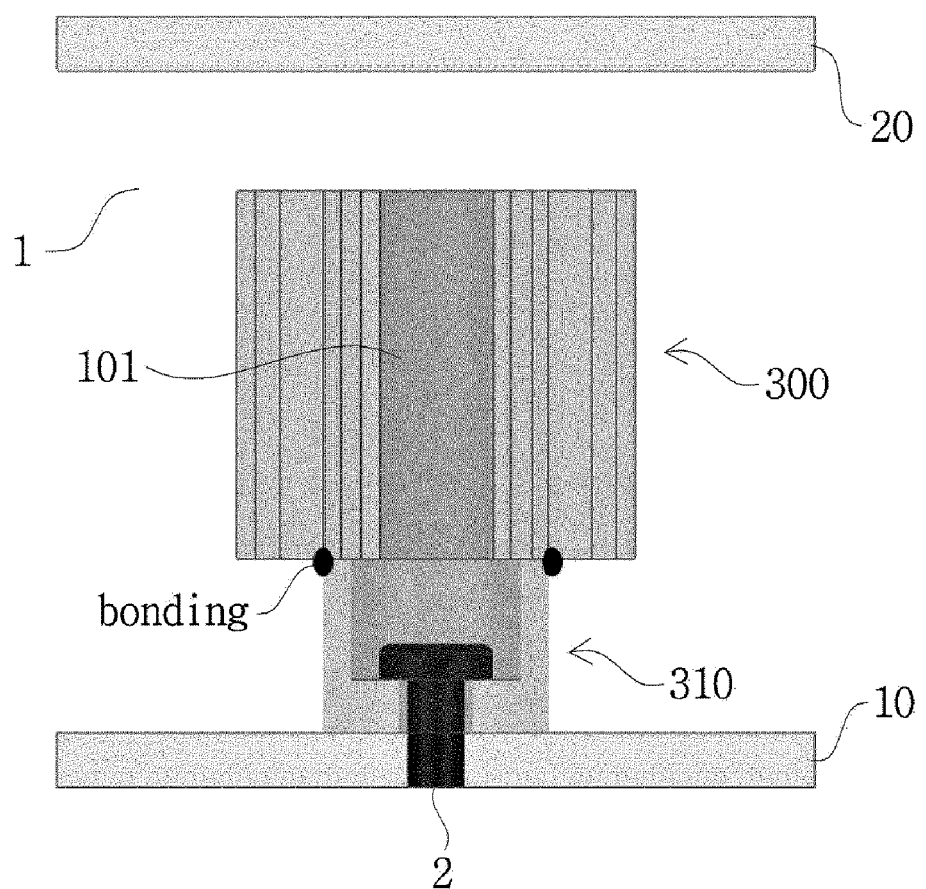
FIG. 5 is a view showing a schematic configuration of a triple-mode dielectric resonator filter according to an embodiment of the present invention.
Figure 6:
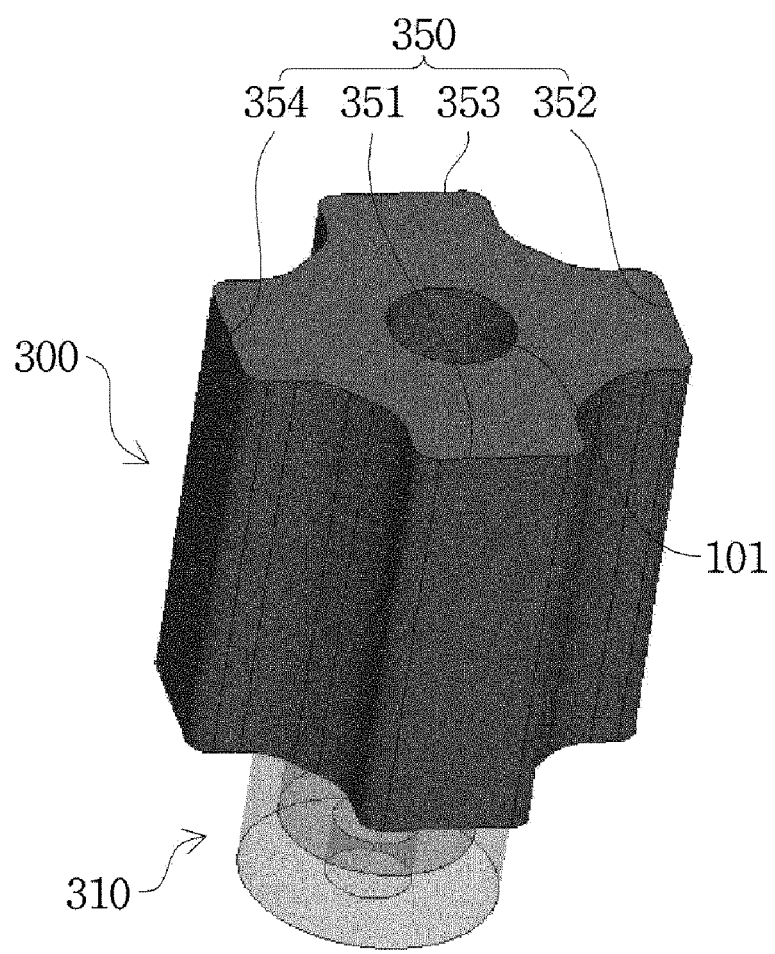
FIG. 6 is a view for schematically showing a dielectric resonator and a dielectric support constituting the triple-mode dielectric resonator filter illustrated in FIG. 5.

FIG. 5 is a cross-sectional view showing a schematic configuration of a triple-mode dielectric resonator filter of TE01δx, TE01δy, and TE01δz modes according to the best embodiment of the present invention. FIG. 6 is a view for schematically showing a dielectric resonator and a dielectric support which constitute the triple-mode dielectric resonator filter, which is the best embodiment illustrated in FIG. 5.

As shown in the drawing, a triple-mode dielectric resonator filter of TE01δx, TE01δy, and TE01δz modes according to an embodiment of the present invention may be provided with a housing 10, a cover 20, a dielectric resonator 300, a dielectric support 310, and a compensation block 350.

More specifically, the housing 10 may be formed to have one side thereof open while being provided with a cavity 1 therein, and the cover 20 may be coupled to the one side of the housing 10 to seal the cavity 1.

The dielectric resonator 300 is provided with a mounting hole 101 for fixing a screw in the center thereof, positioned in the cavity 1 of the housing 10, and may be formed perpendicular to the length direction of the housing 10.

In addition, the dielectric support 310 is coupled to the dielectric resonator 300 through a thermosetting bonding process and may be mounted and fixed by a fixing screw 2 which has passed through the mounting hole 101 for fixing a screw inside the cavity 1 of the housing 10 to support the dielectric resonator 300 to a predetermined height.

Here, the dielectric support 310 coupled to the dielectric resonator 300 by a thermosetting bonding process may be coupled with a bonding material of an epoxy material so that a stable coupling state may be maintained.

A plurality of compensation blocks 350 may be formed to protrude at regular intervals on a side surface of the dielectric resonator 300 to allow the dielectric resonator 300 to operate in three modes.

In an embodiment of the present invention, the plurality of compensation blocks 350 will be described in more detail as follows.

According to an embodiment of the present invention, the plurality of compensation blocks 350 which allow the dielectric resonator 300 to operate in three modes may be formed, as illustrated in the drawing, to be paired with each other such that the horizontal cross-section of the dielectric resonator 300 has a symmetric shape.

Here, the plurality of compensation blocks 350 may be such that compensation blocks 350 adjacent to each other on the side surface of the dielectric resonator 300 are smoothly connected to a curved surface having a cross-section in an arc shape.

That is, as illustrated in FIG. 5 and FIG. 6, in an embodiment of the present invention, first to fourth compensation blocks 351, 352, 353, and 354 of the plurality of compensation blocks 350 nay be formed to be adjacent to each other while maintaining a predetermined interval therebetween. In this case, when a first compensation block 351 and a second compensation block 352, the second compensation block 352 and a third compensation block 353, the third compensation block 353 and a fourth compensation block 354, and the fourth compensation block 354 and the first compensation block 351 are formed to be adjacent to each other, each thereof may be connected to a curved surface having a cross-section in an arc shape.

In addition, the first compensation block 351 and the third compensation block 353, and the second compensation block 352 and the fourth compensation block 354 are positioned to face each other and are formed in the same shape symmetrically.

At this time, when the cross-sectional shape of the dielectric resonator 300 constituting the dielectric resonator filter and operating in three modes according to an embodiment of the present invention may be formed similar to a cross shape having the mounting hole 101 for fixing a screw in the center as a whole.

Meanwhile, in an embodiment of the present invention, in order to allow the dielectric resonator 300 in three modes, the height of the dielectric resonator 300 and the length between the plurality of compensation blocks facing each other based on the horizontal cross-section of the dielectric resonator 300 may be adjusted.

Referring to FIG. 7 to FIG. 10, the technical properties and the expected effects according to the embodiment of the present invention will be described in detail as follows.

Figure 7:
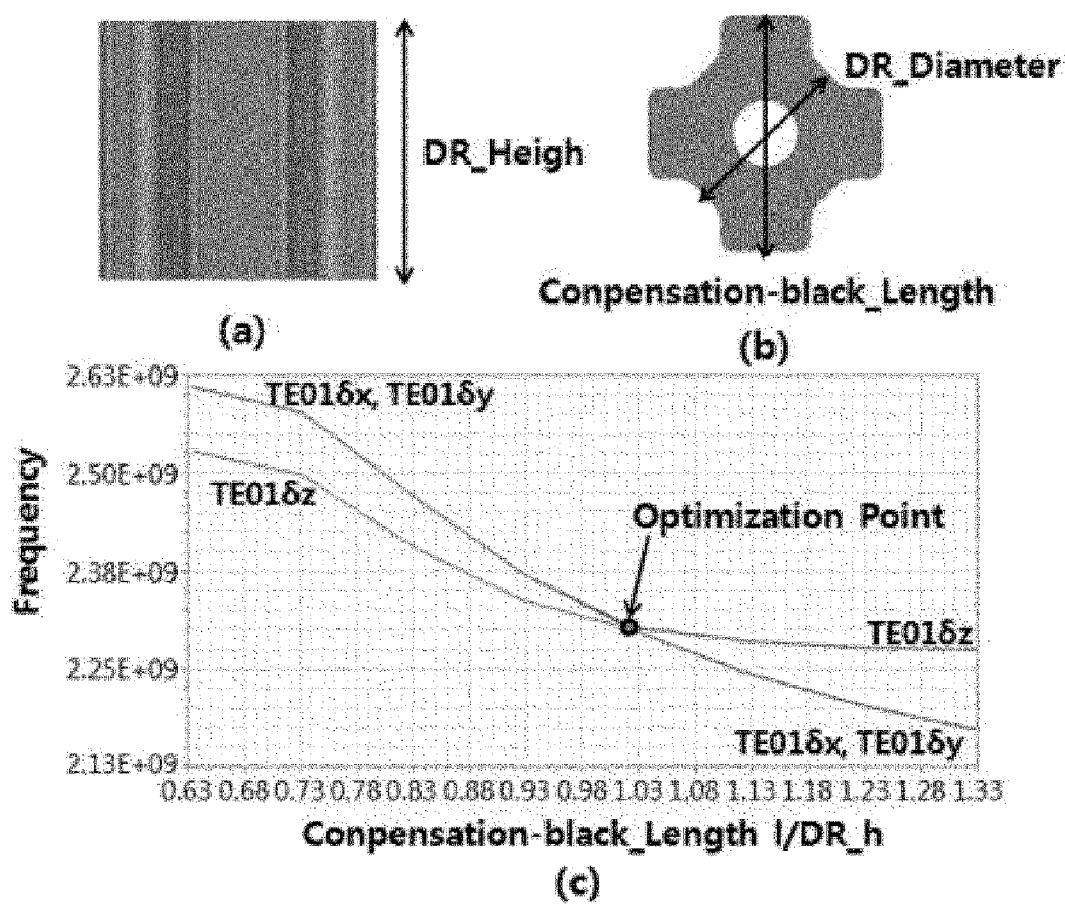
FIG. 7 is a view for describing the correlation between the diameter of a compensation block and the height of a compensation block of the dielectric resonator illustrated in FIG. 5 and FIG. 6.

FIG. 7 is a view for explaining the correlation between the diameter of a compensation block and the height of a compensation block of the dielectric resonator illustrated in FIG. 5 and FIG. 6.

As shown in FIG. 7, in the triple-mode dielectric resonator filter according to an embodiment of the present invention, the height Dr_height of the dielectric resonator 300 and the length Compensation block_diameter between the plurality of compensation blocks facing each other based on the horizontal cross-section of the dielectric resonator 300 described with reference to FIG. 5 and FIG. 6 may be adjusted to an optimized state to set resonant frequencies operating in three modes.

At this time, the reference numeral Dr_diameter (diameter) illustrated in the drawing is the length representing the horizontal cross-sectional diameter of a dielectric resonator according to the prior art in which a compensation block is not formed, and may be adjusted, if necessary, to reduce the size of an entire dielectric resonator according to the present invention.

Meanwhile, referring to (c) of FIG. 7, the triple-mode dielectric resonator filter according to an embodiment of the present invention will be described in detail as follows.

In an embodiment of the present invention, when the height of a dielectric resonator is relatively greater than the length between a plurality of compensation blocks facing each other based on the horizontal cross-section of the dielectric resonator, it can be seen that a resonant frequency of TE01δx and TE01δy modes is higher than a resonant frequency of TE01δz mode in resonant frequencies operating in three modes.

That is, in other words, when the height of the dielectric resonator is relatively less than the length between the plurality of compensation blocks facing each other based on the horizontal cross-section of the dielectric resonator, it can be seen that a resonant frequency of TE01δx and TE01δy modes is lower than a resonant frequency of TE01δz mode in resonant frequencies operating in three modes.

As a result, according to an embodiment of the present invention, when the height of a dielectric resonator is the same as the length between a plurality of compensation blocks facing each other based on the horizontal cross-section of the dielectric resonator, a resonant frequency of TE01δx and TE01δy modes may be similar to a resonant frequency of TE01δz mode in resonant frequencies operating in three modes.

By using the relationship between a height of the dielectric resonator and a length of the compensation block, the triple-mode dielectric resonator filter according to the embodiment of the present invention may set a resonance frequency operating in an optimized state.

Figure 8:
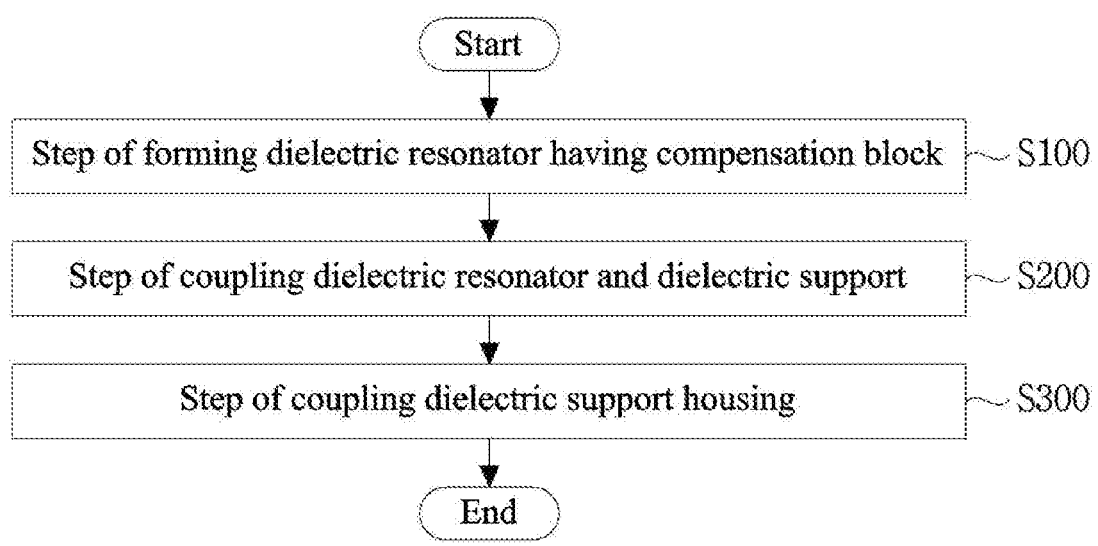
FIG. 8 is a flowchart schematically showing a method for manufacturing a triple-mode dielectric resonator filter according to an embodiment of the present invention.

FIG. 8 is a flowchart schematically showing a method for manufacturing a triple-mode dielectric resonator filter according to an embodiment of the present invention.

Referring to FIG. 8, the method for manufacturing a triple-mode dielectric resonator filter according to an embodiment of the present invention may include a first step S100 of forming the dielectric resonator 300 by allowing the compensation block 350 described above to protrude therefrom, a second step S200 of coupling the dielectric resonator 300 and the dielectric support 310, and a third step S300 of fixing the dielectric support 310 to a housing using a screw 2.

By the method for manufacturing a dielectric resonator filter described above, problems of a triple-mode dielectric resonator filter according to the prior art may be solved.

More specifically, in the first step S100, the mounting hole 101 for fixing a screw may be provided in the center of the dielectric resonator 300 of a dielectric material which operates in three modes of TE01δx, TE01δy, and TE01δz, and the compensation blocks 350 may be formed to protrude at regular intervals on a side surface of the dielectric resonator 300.

In addition, in the second step S200, the dielectric support 310 of an alumina material which supports the dielectric resonator 300 may be bonded and coupled thereto through an epoxy bonding process, and then subjected to a thermal-curing process through a heat treatment process. As a result, the heat treatment process may be performed at a higher temperature than in the prior art, so that the effect of a curing process may be increased.

In addition, in the third step S300, the dielectric support 310 to which the dielectric resonator 300 is coupled through a thermal-curing process may be fixed to the housing 10 using the screw 2 inserted through the mounting hole 101 for fixing a screw in the housing 10 constituting the triple-mode dielectric resonator filter.

As a result, as described above, the method for manufacturing a triple-mode dielectric resonator filter according to an embodiment of the present invention may adjust the height of a dielectric resonator and the length between a plurality of compensation blocks facing each other based on the horizontal cross-section of the dielectric resonator to an optimized state to set resonant frequencies operating in three modes.

Figure 9:
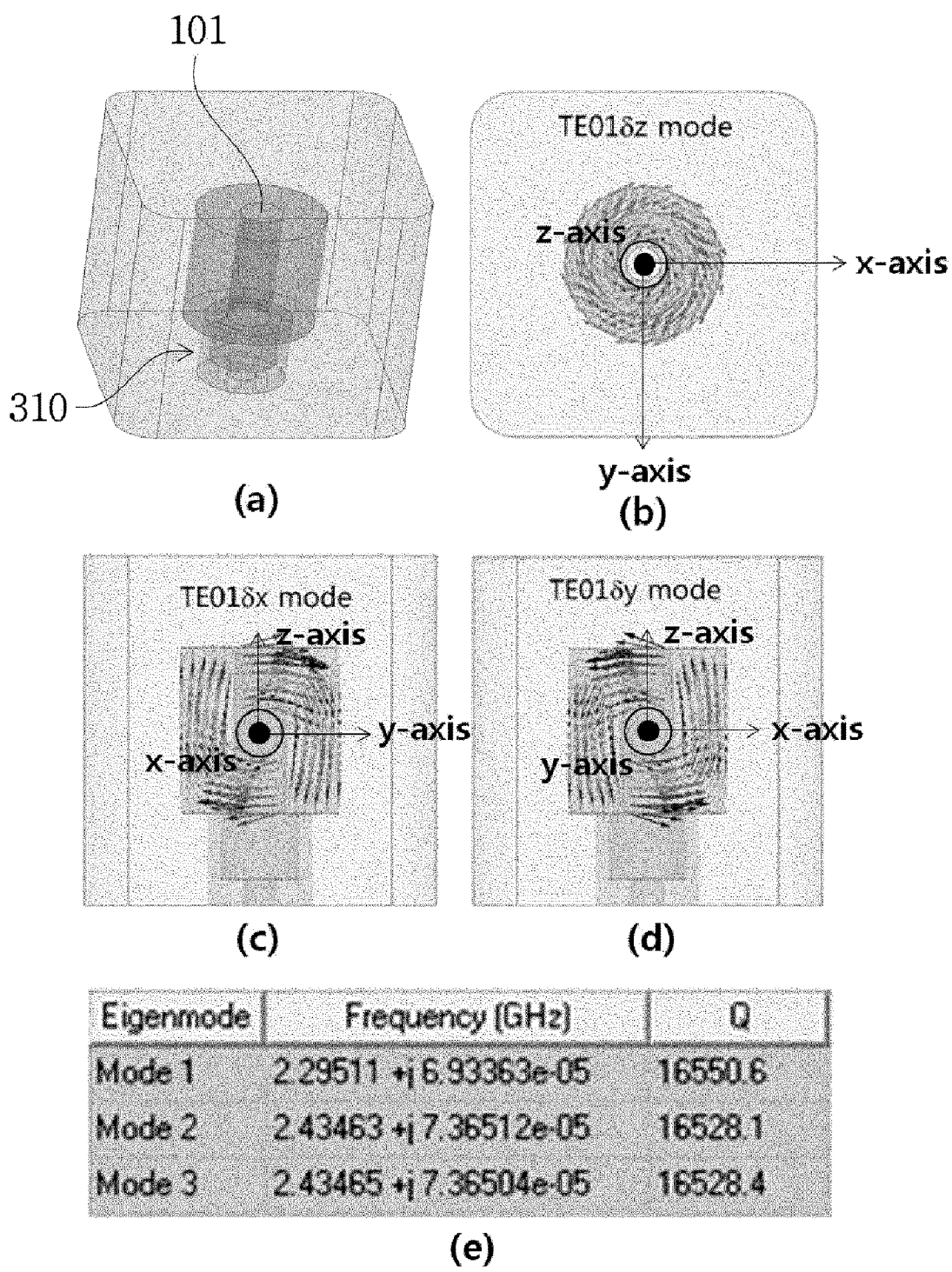
FIG. 9 and FIG. 10 are views for comparing and describing a triple-mode dielectric resonator filter of TE01δx, TE01δy, and TE01δz modes according to each of the prior art and an embodiment of the present invention.
Figure 10:
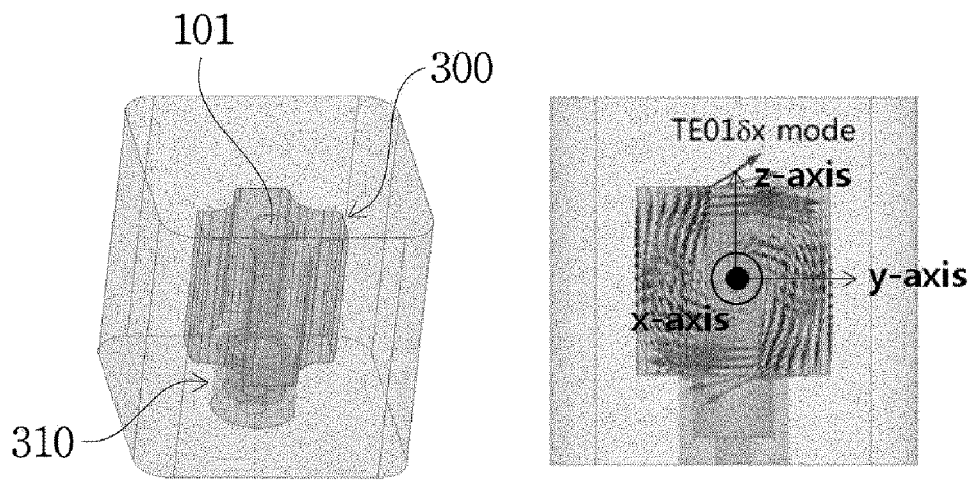
Figure 10:
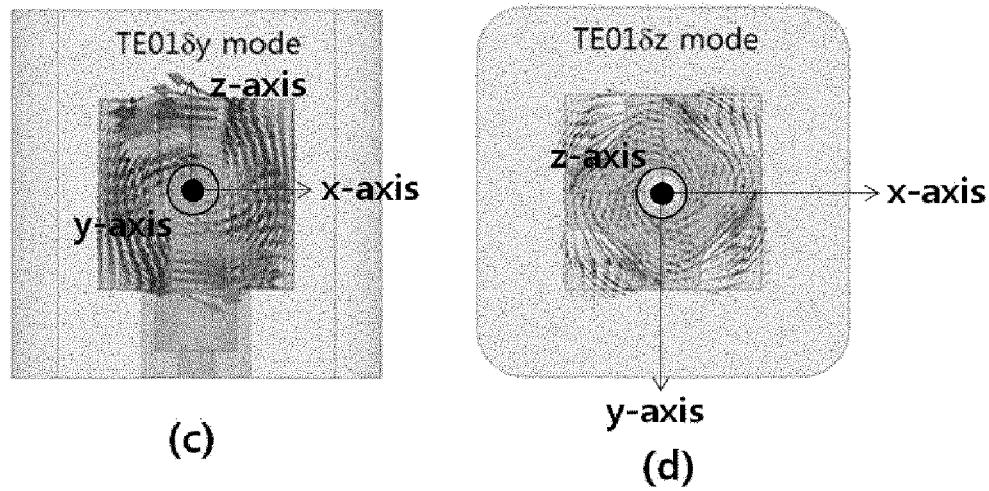

FIG. 9 and FIG. 10 are views for comparing and describing a triple-mode dielectric resonator filter of TE01δx, TE01δy, and TE01δz according to each of the prior art and an embodiment of the present invention.

Referring to FIG. 9, the triple-mode dielectric resonator filter according to the prior art will be described as follows.

(a) of FIG. 9 shows a shape in which a hole for mounting a screw is implemented in the center of a cylindrical-shaped triple-mode dielectric resonator filter of TE01δx, TE01δy, TE01δz according to the prior art not having a compensation block.

Also, as illustrated in (b) and (c) of FIG. 9, an E-field of two modes of TE01δx and TE01δy is seen to pass through a central screw and rotate.

That is, since the E-field passes through a screw hole filled with air (air: dielectric constant 1), not with a dielectric of a ceramic material, a resonant frequency may be moved upward.

Here, in (d) of FIG. 9, the E-field of TE01δz mode is hardly distributed around the screw hole. Therefore, in this case, the resonant frequency is less affected by the screw hole so that the existing resonant frequency may be maintained as it is.

As a result, (e) of FIG. 9 shows an analysis result according to the prior art, and it can be seen that resonant frequencies of Mode2 and Mode3, which are respectively TE01δx and TE01δy, were moved upward by about 140 MHz from a resonant frequency of TE01δz mode, which is Mode1.

Next, referring to FIG. 10, the triple-mode dielectric resonator filter according to an embodiment of the present invention will be described in detail as follows.

FIG. 10 shows the distribution of E-fields for each resonant mode rotating about each axis (x, y, and z) in the triple-mode dielectric resonator filter of the present invention.

(a) of FIG. 10 shows the structure of the triple-mode dielectric resonator filter according to the present invention.

In (b) of FIG. 10, Mode 1 is TE01δx and it can be seen from a side view (b) of FIG. 8 that the E-field rotates about an x-axis, and Mode 2 is TE01δy and it can be seen from a side view (c) of FIG. 10 that the E-field rotates about an y-axis. Lastly, Mode 3 is TE01δz and it can be seen from a top view (d) of FIG. 10 that the E-field rotates about a z-axis.

As a result, (e) of FIG. 10 shows a simulation result for the triple-mode dielectric resonator filter according to an embodiment of the present invention, and it can be seen that by using the compensation block 350 according to the present invention, it can be seen that all of the three modes of TE01δx, TE01δy, and TE01δz have a similar resonance frequency.

As described above, the present invention has an effect of providing a triple-mode dielectric resonator filter capable of implementing a resonator operating in three modes while implementing a mounting hole for fixing a screw in the center of the dielectric resonator by forming a compensation block in the dielectric resonator embedded in a housing constituting the filter.

In addition, the present invention has the effect of setting resonance frequencies operating in three modes by adjusting the height of a dielectric resonator and the length between a plurality of compensation blocks facing each other based on the horizontal cross section of the dielectric resonator to an optimized state.

The present invention relates to a band pass filter including a dielectric resonator operating at a triple-mode resonant frequency of TE01δx, TE01δy, and TE01δz according to the present invention and an NRN stub.

Mode For Carrying Out the Invention

Hereinafter, exemplary embodiments of the present invention will be described in detail with reference to the accompanying drawings.

Figure 11:
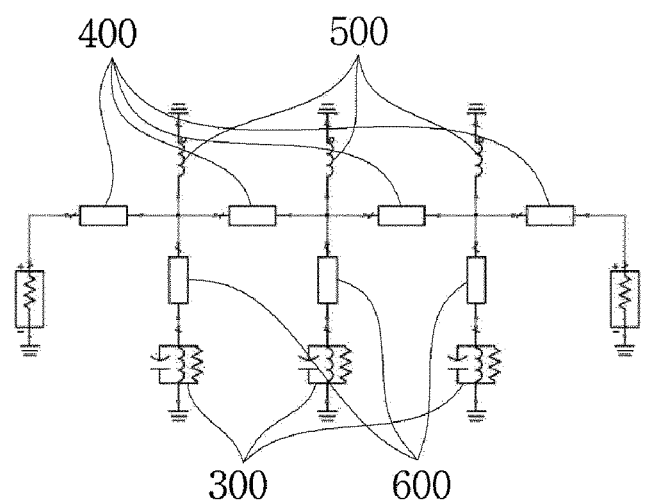
FIG. 11 is an equivalent circuit diagram for the structure of a band pass filter using a dielectric resonator and an NRN stub according to an embodiment of the present invention.
Figure 12A:
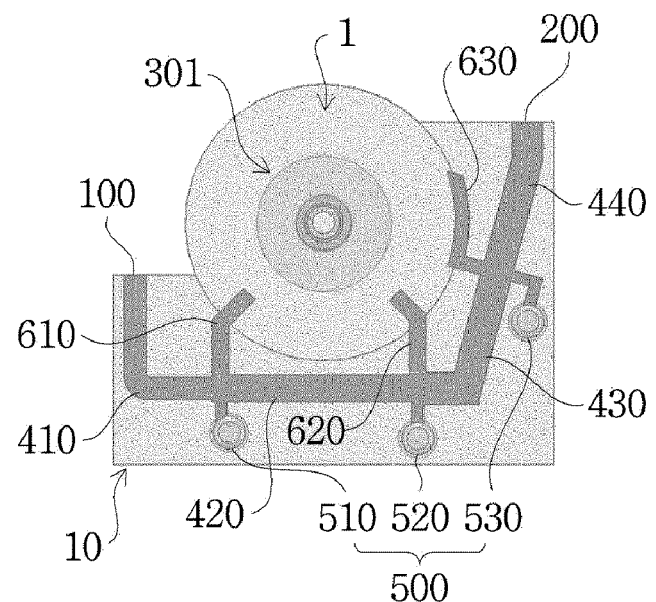
FIG. 12a is a plan view of a band pass filter using a dielectric resonator and an NRN stub according to another embodiment of the present invention.
Figure 12B:
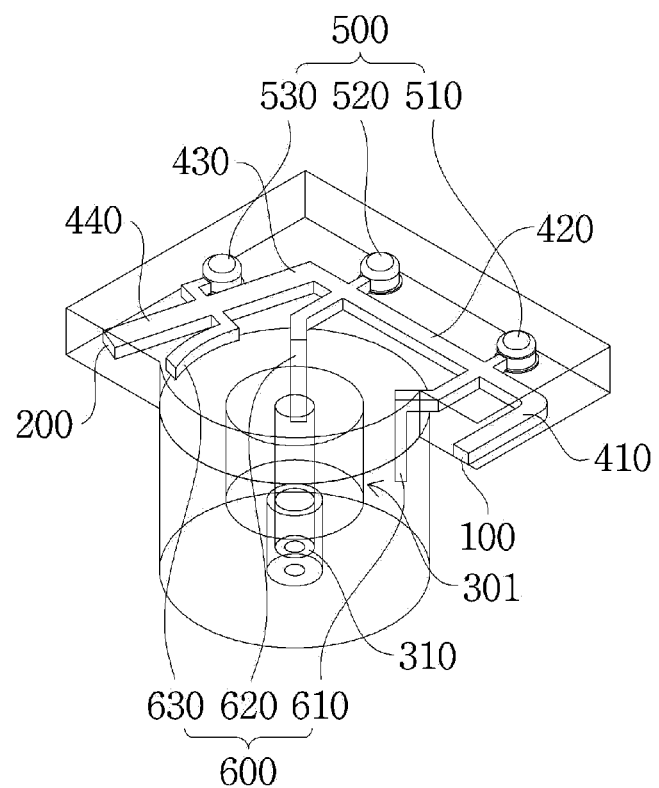
FIG. 12b is a perspective view of a band pass filter using a dielectric resonator and an NRN stub according to another embodiment of the present invention.

FIG. 11 is an equivalent circuit diagram for the structure of a band pass filter using a dielectric resonator and an NRN stub according to an embodiment of the present invention. FIG. 12a is a plan view of a band pass filter using a dielectric resonator and an NRN stub according to another embodiment of the present invention. FIG. 12b is a perspective view of a band pass filter using a dielectric resonator and an NRN stub according to another embodiment of the present invention.

The band pass filter according to the present invention may be provided with, as illustrated in FIG. 5, the housing 10, the cover 20, the cavity 1, a fixing screw 2, the mounting hole 101 for fixing a screw, and the dielectric support 310.

More specifically, the housing 10 may be formed to have one side thereof open while being provided with a cavity 1 therein, and the cover 20 may be coupled to the one side of the housing 10 to seal the cavity 1.

As illustrated in FIG. 12a, the band pass filter according to another embodiment of the present invention includes an input terminal 100, an output terminal 200, a cylindrical-shaped dielectric resonator 301 operating at a triple-mode resonance frequency of TE01δx, TE01δy, and TE01δz, a λ/4 transmission line 400 formed around the dielectric resonator 301, an non-resonating node (NRN) stub 500 connected to the λ/4 transmission line 400 and capable of obtaining the same number of transmission zeros and reflection zeros as the number of modes of the dielectric resonator 301, a coupling stub 600 connected to the λ/4 transmission line 400 and formed around the dielectric resonator 301 as a coupling means for mutually coupling the dielectric resonator 301 and the NRN stub 500, and operates at a triple-mode resonance frequency of TE01δx, TE01δy, and TE01δz.

The single dielectric resonator 301 is disposed at the center of the cavity 1 provided inside the housing 10.

The λ/4 transmission line 400 is provided in a plurality of first to fourth λ/4 transmission lines 410, 420, 430, and 440 and formed along the outside of the cavity 1 while surrounding the dielectric resonator 301.

The input terminal 100 to which a high-frequency signal is input is formed on one side of a λ/4 transmission line 410, and the output terminal 200 from which a high-frequency signal is output is formed on the other side of a transmission line 440 to correspond to the input terminal 100.

Figure 13A:
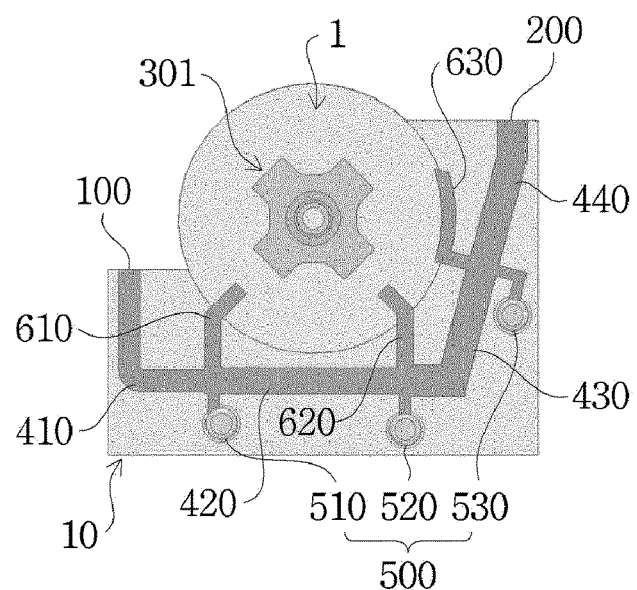
FIG. 13a is a plan view of a band pass filter using a dielectric resonator and an NRN stub according to yet another embodiment of the present invention.
Figure 13B:
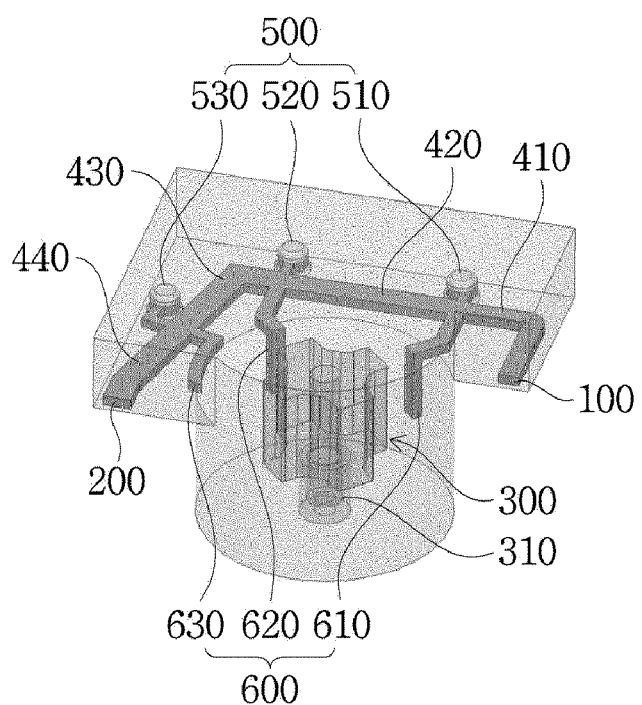
FIG. 13b is a perspective view of a band pass filter using a dielectric resonator and an NRN stub according to yet another embodiment of the present invention.

FIG. 13a is a plan view of the structure of a band pass filter using a dielectric resonator and an NRN stub according to another embodiment of the present invention, and FIG. 13b is a perspective view of a band pass filter using a dielectric resonator and an NRN stub according to another embodiment of the present invention.

Referring to FIG. 13a and FIG. 13b, a band pass filter using a dielectric resonator and an NRN stub according to another embodiment of the present invention will be described.

Figure 3:
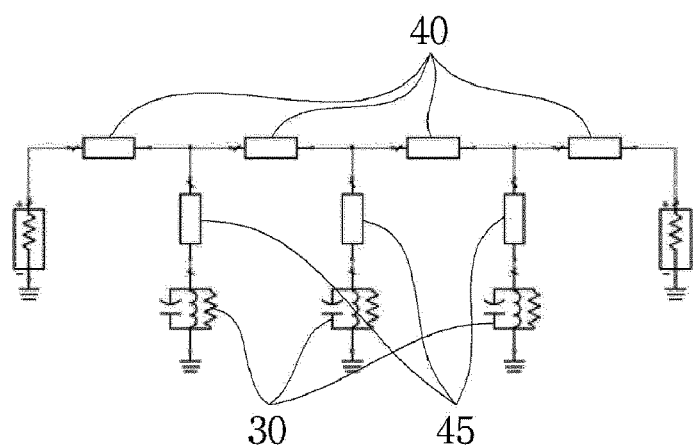
FIG. 3 is an equivalent circuit diagram of a band rejection filter (BRF) using a triple-mode dielectric resonator which is the prior art.
Figure 4:
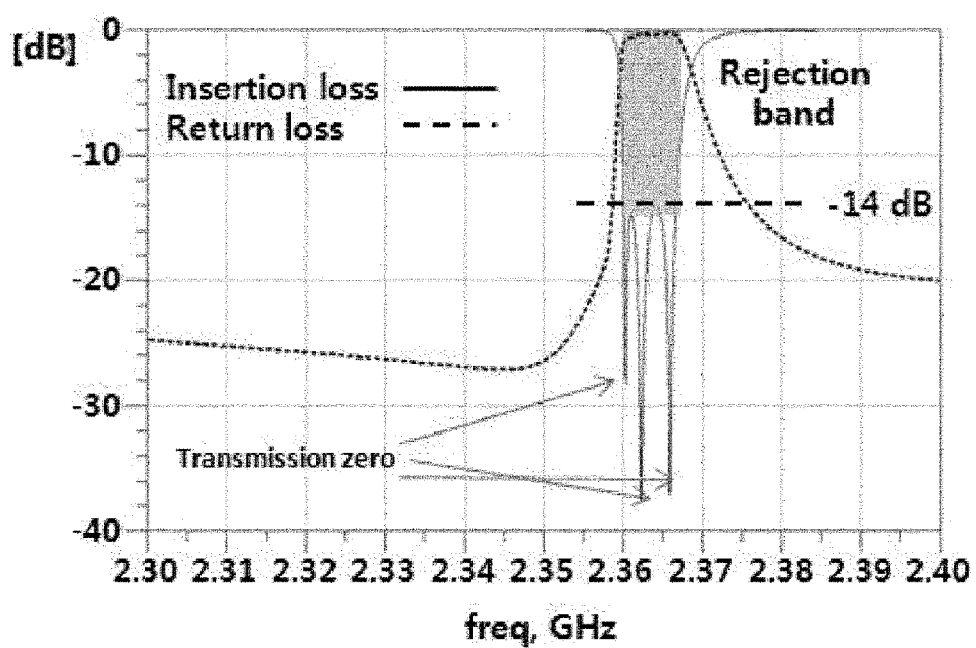
FIG. 4 is a view showing S-parameter properties for the band rejection filter according to FIG. 3.

As illustrated, when comparing a band pass filter including the dielectric resonator 300 and the NRN stub 500 of the present invention with the configuration of the circuit diagram of a band rejection filter illustrated in FIG. 3, which is the prior art, the dielectric resonator 300 and the λ/4 transmission line 400 are components commonly provided. The band rejection filter using a dielectric resonator illustrated in FIG. 3 includes the resonator circuit 30 of the dielectric resonator, the λ/4 transmission line 40, and the inductance 45 as a coupling means between the resonator circuit 30 and the λ/4 transmission line 40. The band pass filter according to the present invention further includes the NRN stub 500 as illustrated in FIG. 11 and FIG. 13a. While the coupling means 45 illustrated in FIG. 3 is a coupling means formed between the resonator circuit 30 and the λ/4 transmission line 40, according to the band pass filter by the present invention illustrated in FIG. 13a, the coupling stub 600, which is a coupling means, is different from the coupling means 45 in that it is a coupling means formed between the dielectric resonator 300 and the NRN stub 500, and the operation principle of the coupling stub 600 is also different from that of the coupling means 45.

More specifically, the NRN stub 500 of the band pass filter according to the present invention includes a plurality of NRN stubs 510, 520, and 530 in each of TE01δx, TE01δy, and TE01δz modes formed along the outside of the transmission line. In addition, the NRN stub 500 according to the present invention is preferably formed as an inductive NRB stub 500 acting as an inductor.

Also, the coupling stub 600 of the dielectric resonator 300 of the band pass filter according to the present invention is formed to correspond to each of the NRN stubs 510, 520, and 530 for each mode of the dielectric resonator 300. That is, a coupling stub 610 for TE01δx mode, a coupling stub 620 for TE01δy mode, and a coupling stub 630 for TE01δz mode are formed, respectively.

In the band pass filter according to the present invention, the input terminal 100 to which a high-frequency signal is input is connected to one side of the first λ/4 transmission line 410, and the other side of the first λ/4 transmission line 410 is connected to one side of a second λ/4 transmission line 420. In order to vertically intersect the intersection point at which the first λ/4 transmission line 410 and the second λ/4 transmission line 420 are connected, an NRN stub 510 of TE01δx mode and the coupling stub 610 of TE01δx mode are connected in the opposite direction.

The other side of the second λ/4 transmission line 420 is connected to one side of a third λ/4 transmission line 430. In order to vertically intersect the intersection point at which the second λ/4 transmission line 420 and the third λ/4 transmission line 430 are connected, an NRN stub 520 of TE01δy mode and the coupling stub 620 of TE01δy mode are connected in the opposite direction.

The other side of the third λ/4 transmission line 430 is connected to one side of the fourth λ/4 transmission line 440. In order to vertically intersect the intersection point at which the third λ/4 transmission line 430 and the fourth λ/4 transmission line 440 are connected, an NRN stub 530 of TE01δz mode and the coupling stub 630 of TE01δz mode are connected in the opposite direction, and to the other side of the fourth λ/4 transmission line 440, the output terminal 200 is connected.

The dielectric resonator 300 constituting a band pass filter according to another embodiment of the present invention is attached by the dielectric support 310 in the housing 10.

The NRN stubs 510, 520, and 530 formed in each of TE01δx, TE01δy, and TE01δz modes have each end thereof formed as a short circuit line.

In addition, the coupling stubs 610, 620, and 630 of each of TE01δx, TE01δy, and TE01δz formed corresponding to the NRN stubs 510, 520, and 530 have each end thereof formed as an open line.

As illustrated, the band pass filter using a dielectric resonator and an NRN stub according to another embodiment of the present invention includes the input terminal 100, the output terminal 200, the dielectric resonator 300 provided with a compensation block operating at the triple-mode resonance frequency of TE01δx, TE01δy, and TE01δz, the λ/4 transmission line 400 formed around the dielectric resonator 300 provided with the compensation block, the NRN stub 500 connected to the λ/4 transmission line 400 and capable of obtaining the same number of transmission zeros and reflection zeros as the number of modes of the dielectric resonator 300, the coupling stub 600 connected to the λ/4 transmission line 400 and formed around the dielectric resonator 300 as a coupling means between the dielectric resonator 300 and the NRN stub 500.

That is, the NRN stubs 510, 520, and 530 are formed for each of TE01δx, TE01δy, and TE01δz modes. The coupling stub 600 according to the dielectric resonator 300 of the triple-mode resonance frequency of TE01δx, TE01δy, and TE01δz formed corresponding to the NRN stubs 510, 520, and 530 is connected to the λ/4 transmission line 400 to form the coupling stub 610 for TE01δx mode, the coupling stub 620 for TE01δy mode, and the coupling stub 630 for TE01δz mode of the triple-mode dielectric resonator 300.

Figure 14A:
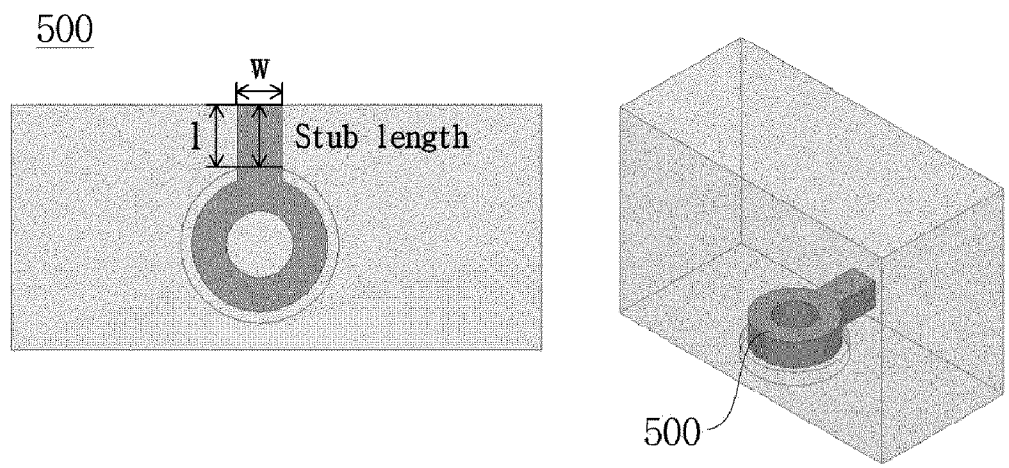
FIG. 14a is a view showing the detailed structure of an inductive NRN stub according to another embodiment of the invention.

FIG. 14a is an enlarged view of an inductive NRN stub in the band pass filter according to another embodiment of the present invention illustrated in FIG. 13a.

As illustrated, the inductive NRN stub 500 connected to the λ/4 transmission line 400 has a structure of being shorted to the housing using a metal bolt.

The reactance value of the stub may be adjusted using the length 1 and width w of the inductive NRN stub 500.

Figure 14B:
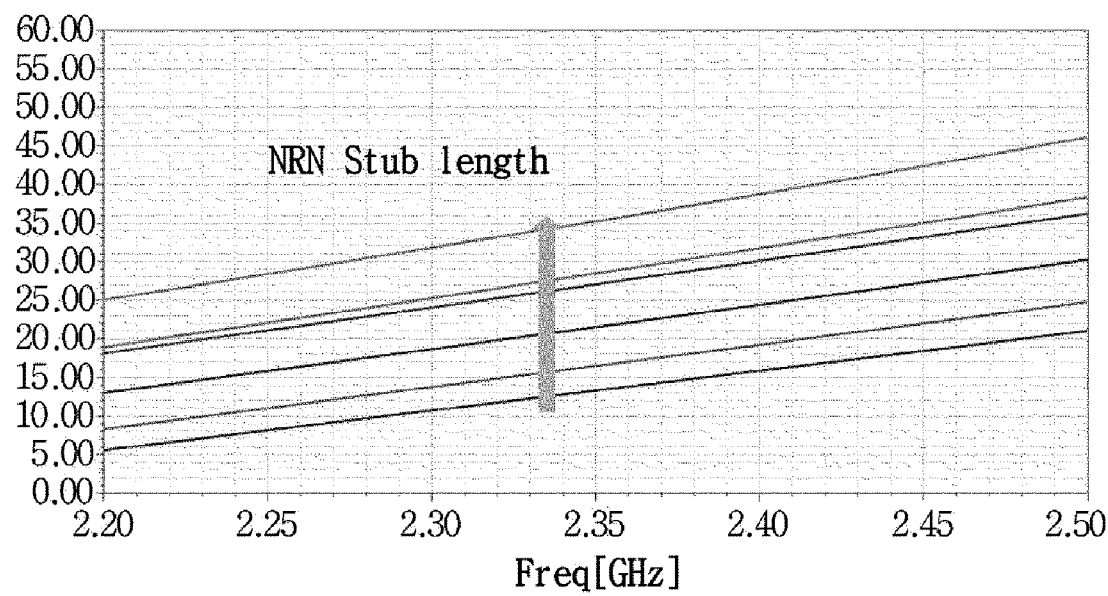

FIG. 14b is a view showing a change in the reactance value of an inductive NRN stub according to the length of the inductive NRN stub in the band pass filter according to FIG. 14a.

That is, when the width w of the inductive NRN stub 500 is decreased and the length 1 thereof is increased, as shown in the graph in the upper side of the view, an inductance L is increased. On the other hand, when the width w of the inductive NRN stub 500 is increased and the length 1 thereof is decreased, the inductance L is decreased.

As illustrated in FIG. 14b, as the length 1 of the stub 500 is increased, the inductance value of the NRN stub is increased, and accordingly, the reactance value which determines the value of the NRN stub 500 is increased.

Figure 15A:
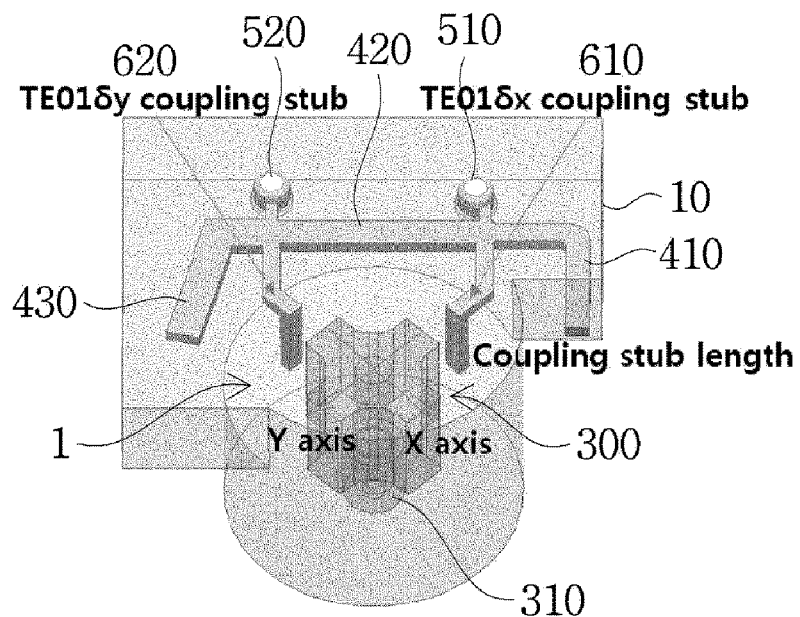
FIG. 15a is a view for describing the coupling structure between an NRN stub and a dielectric resonator in TE01δx and TE01δy modes.

FIG. 15a is a detailed view of the coupling stub structure formed between an NRN stub and a dielectric resonator of TE01δx and TE01δy modes.

As illustrated, the structure of coupling is arranged perpendicular to minimize parasitic coupling having the same direction of a field and occurring between each mode and each coupling structure.

That is, since the coupling stub 610 of TE01δx mode and the coupling stub 620 of TE01δy mode have a structure of being disposed to be perpendicular to each other, parasitic coupling components which may occur between each mode and each coupling structure are minimized, thereby reducing the distortion of each mode signal.

Meanwhile, the length of the coupling stub 610 for TE01δx mode is varied in a z-axis direction. Also, the length of the coupling stub 620 for TE01δy mode is varied in the z-axis direction.

That is, while the interval with the dielectric resonator is maintained, the length is varied in the z-axis direction, which is vertically downward.

Figure 15B:
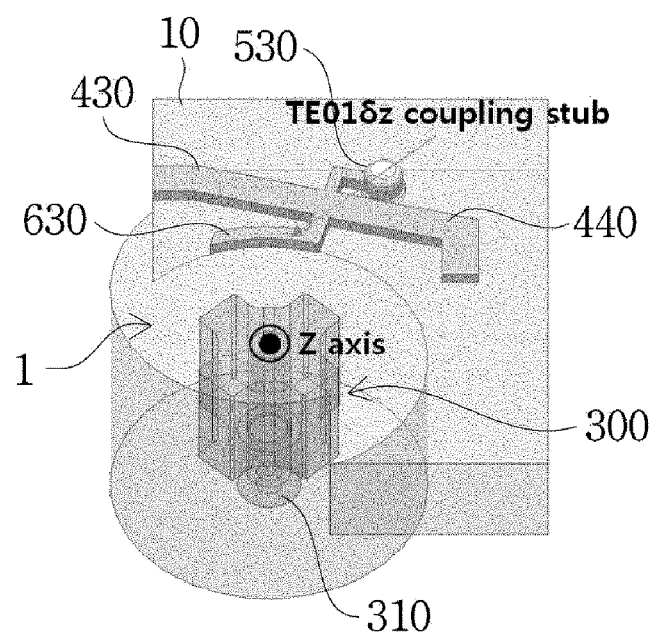
FIG. 15b is a view for describing the coupling structure between an NRN stub and a dielectric resonator in TE01δz mode.

FIG. 15b is a detailed view of the coupling structure between an NRN stub and a dielectric resonator of TE01δz mode.

The coupling structure 630 of TE01δz mode was also designed to be vertical to minimize the parasitic coupling structure with a resonator of TE01δx and TE01δy modes.

As illustrated, the length of the coupling stub 630 for TE01δz mode is varied so that the length is changed along the direction of the circumference of the dielectric resonator 300.

Figure 15C:
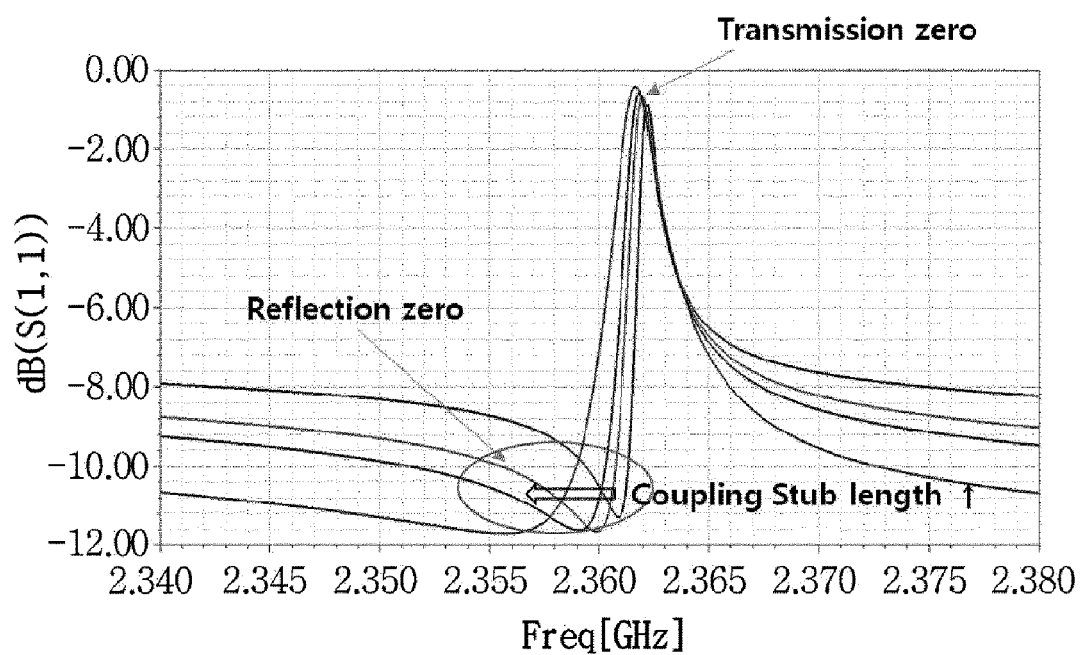
FIG. 15c is a simulation result of the coupling value according to the length of a coupling stub.

FIG. 15c is a simulation result of the coupling value according to the length of a coupling stub.

As illustrated, as the length of the coupling stub 600 is increased, the coupling value is increased, and as the coupling value is increased, the transmission zero and the reflection zero is farther away. By adjusting the length of a coupling stub, the position of a desired transmission zero and a desired reflection zero may be adjusted.

That is, by the appropriate combination of the dielectric resonator 300 and the NRN stub 500, and the coupling stub 600 disposed between the dielectric resonator 300 and the NRN stub 500, a reflection zero is generated, and by the reflection zero, a pass-band is formed.

In addition, when the coupling value of the coupling stub 600 is increased, the rejection level is affected, thereby forming a rejection band. That is, the rejection bandwidth by the transmission zero generated by the dielectric resonator 300 provided with a compensation block is consequently affected by the coupling value of the coupling stub 600, thereby suppressing the bandwidth.

As illustrated in FIG. 15c, as the length of the coupling stub 600 is increased, that is, the length of the coupling stub 610 of TE01δx mode, the coupling stub 620 of Te01δy mode, and the coupling stub 630 of TE01δz mode, the reflection zero is moved to the left due to the increase in signal coupling. Therefore, intervals between the reflection zeros become wider, so that the bandwidth is widened.

Figure 16:
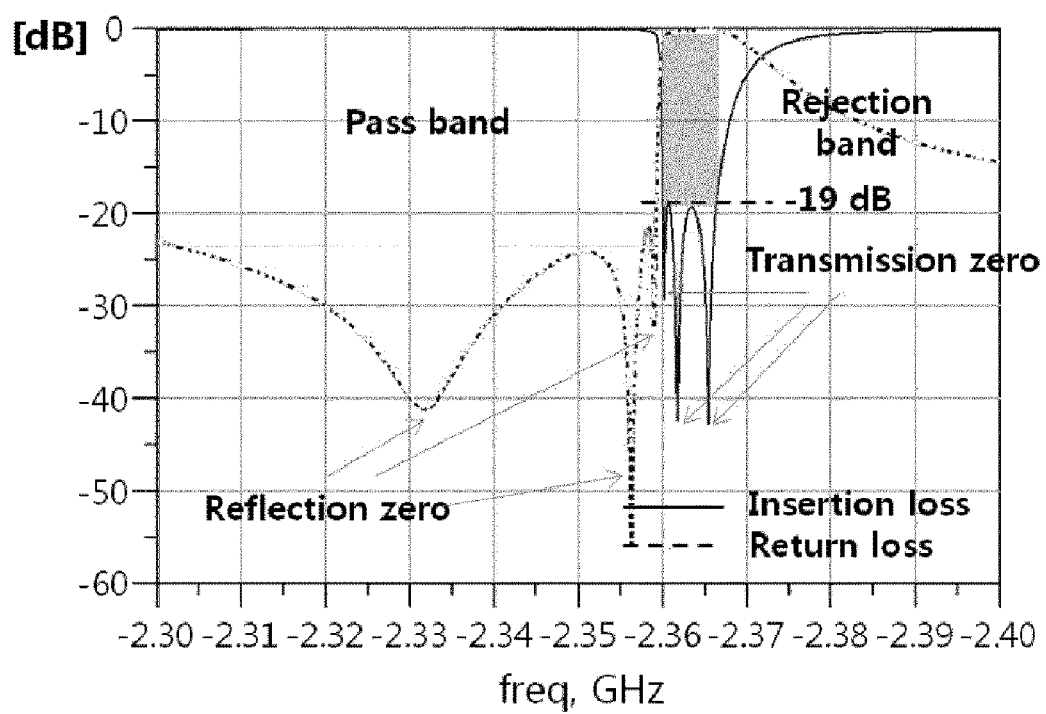

FIG. 16 is a view showing S-parameter properties for the band pass filter according to FIG. 13a.

As illustrated, unlike the band rejection filter according to the prior art illustrated in FIG. 3, the band pass filter using the dielectric resonator 300 and the NRN stub 500 according to another embodiment of the present invention has not only the transmission zero but the reflection zero by the NRN stub 500, so that the length of the coupling stub 600 formed between the dielectric resonator 300 provided with a compensation block and the NRN stub 500 is varied to adjust the pass bandwidth, and it can be seen that the level of rejection is improved.

Meanwhile, in another embodiment of the present invention, the NRN stub 500 has a structure to which an inductive NRN stub using an inductor is applied. However, when a capacitive NRN stub using a capacitor is used as the NRN stub 500, the frequency of the transmission zero may be implemented as a frequency lower than the frequency of the reflection zero, so that the capacitance value of the NRN stub 500 may be adjusted to adjust the interval between the frequency of the transmission zero and the frequency of the reflection zero.

In addition, as in another embodiment of the present invention, when the NRN stub 500 is applied as an inductor to use an inductance component, the frequency of the transmission zero may be implemented at a frequency higher than the frequency of the reflection zero, so that the inductance value of the NRN stub 500 may be adjusted to adjust the interval between the frequency of the transmission zero and the frequency of the reflection zero.

That is, in the present invention, by using the NRN stub 500, the transmission zero may be positioned at a frequency higher than that of the reflection zero.

Figure 17A:
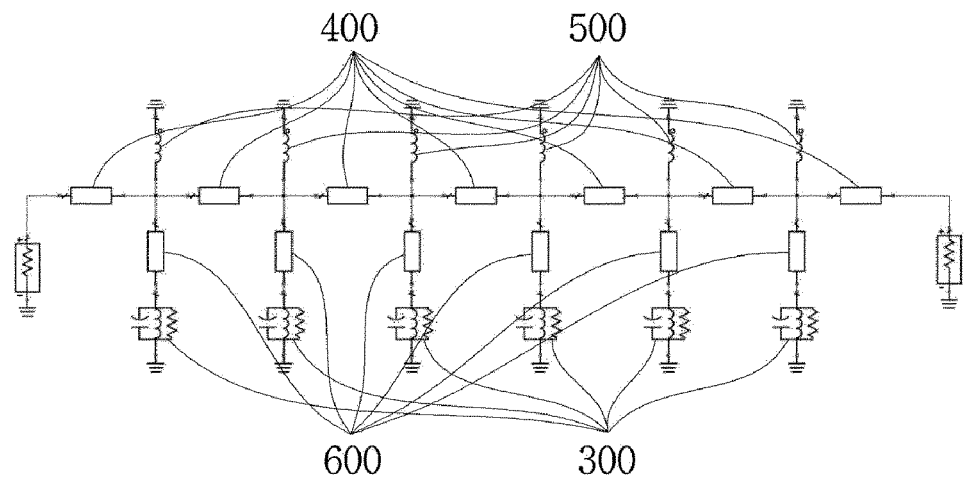
FIG. 17a is an equivalent circuit diagram of a band pass filter designed using two dielectric resonators and an NRN stub according to yet another embodiment of the present invention.

FIG. 17a is an equivalent circuit diagram of a band pass filter designed using two dielectric resonators and an NRN stub according to yet another embodiment of the present invention.

That is, FIG. 17a is an equivalent circuit diagram of a band pass filter using two dielectric resonators and an NRN stub to form high rejection of a near band.

Figure 17B:
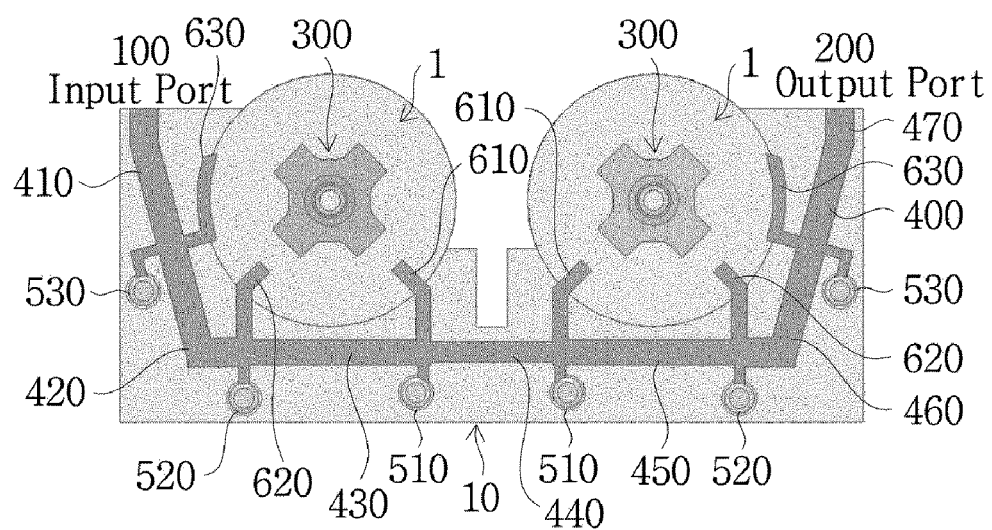
FIG. 17b is a plan view of a band pass filter designed using two dielectric resonators and an NRN stub according to yet another embodiment of the present invention.
Figure 17C:
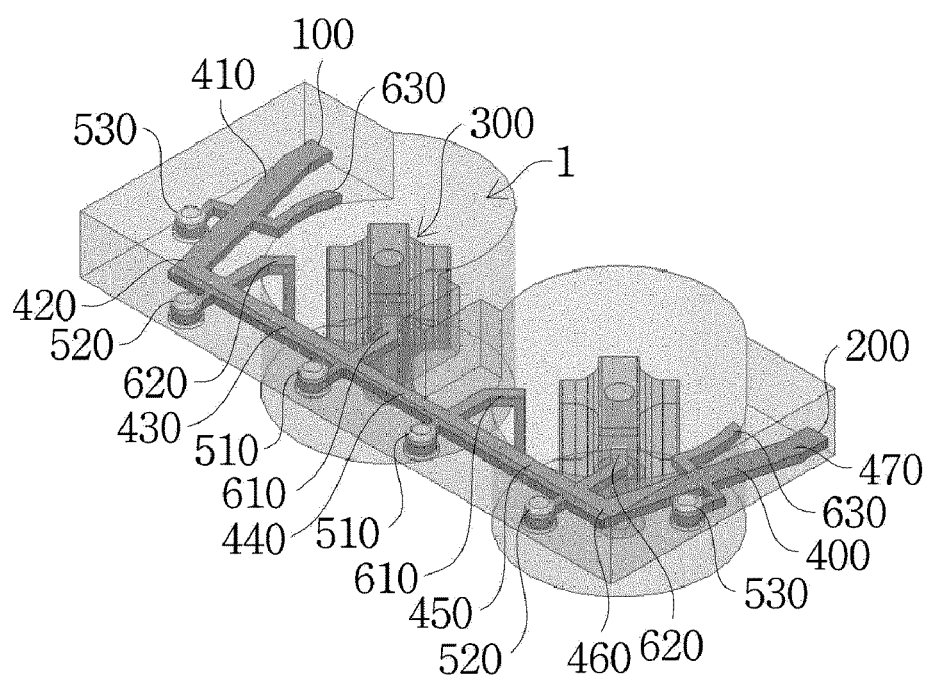
FIG. 17c is a perspective view of a band pass filter designed using two dielectric resonators and an NRN stub according to yet another embodiment of the present invention.

FIG. 17b is a plan view of the structure of a band pass filter designed using a dielectric resonator and an NRN stub according to yet another embodiment of the present invention, and FIG. 17c is a perspective view of a band pass filter designed using two dielectric resonators and an NRN stub according to yet another embodiment of the present invention.

As illustrated, the band pass filter according to yet another embodiment of the present invention may be provided with, as with an embodiment and other embodiments of the present invention, the housing 10, the cover 20, the dielectric resonator 300, and the dielectric support 310.

More specifically, the housing 10 may be formed to have one side thereof open while being provided with a cavity 1 therein, and the cover 20 may be coupled to the one side of the housing 10 to seal the cavity 1.

As illustrated, the band pass filter according to yet another embodiment of the present invention includes the input terminal 100, the output terminal 200, a plurality of dielectric resonators 300 provided with a compensation block operating at the triple-mode resonance frequency of TE01δx, TE01δy, and TE01δz, the λ/4 transmission line 400 formed around the plurality of dielectric resonators 300, the non-resonating node (NRN) stub 500 connected to the λ/4 transmission line 400 and capable of obtaining the same number of transmission zeros and reflection zeros as the number of modes of the plurality of dielectric resonators 300, the coupling stub 600 connected to the λ/4 transmission line 400 and formed around the dielectric resonator 300 as a coupling means between the plurality of dielectric resonators 300 and the NRN stub 500, and thus, may be operated at the triple-mode resonant frequency of TE01δx, TE01δy, and TE01δz to improve high rejection properties of a near band.

The dielectric resonator 300 is disposed at the center of the cavity 1 provided inside the housing 10.

The NRN stub 500 has the NRN stubs 510, 520, and 530 formed corresponding to three modes of TE01δx, TE01δy, and TE01δz, and the coupling stub 600 according to the plurality of dielectric resonators 300 operating at the resonance frequencies of three modes of TE01δx, TE01δy, and TE01δz formed corresponding to the NRN stubs 510, 520, and 530 is also connected to the λ/4 transmission lines 410 to 470 formed in plurality and has a plurality of triple mode coupling studs for each of the dielectric resonator 300 having the compensation block, that is, the coupling stub 610 for TE01δx mode, the coupling stub 620 for TE01δy mode, and the coupling stub 630 for TE01δz mode.

In yet another embodiment of the present invention, like the structure of the band pass filter according to one embodiment and other embodiments, the NRN stubs 510, 520, and 530 formed in each of TE01δx, TE01δy, and TE01δz modes have each end thereof formed as a short circuit line, and the coupling stubs 610, 620, and 630 of each of TE01δx, TE01δy, and TE01δz formed corresponding to the NRN stubs 510, 520, and 530 have each end thereof formed as an open line.

Figure 17D:
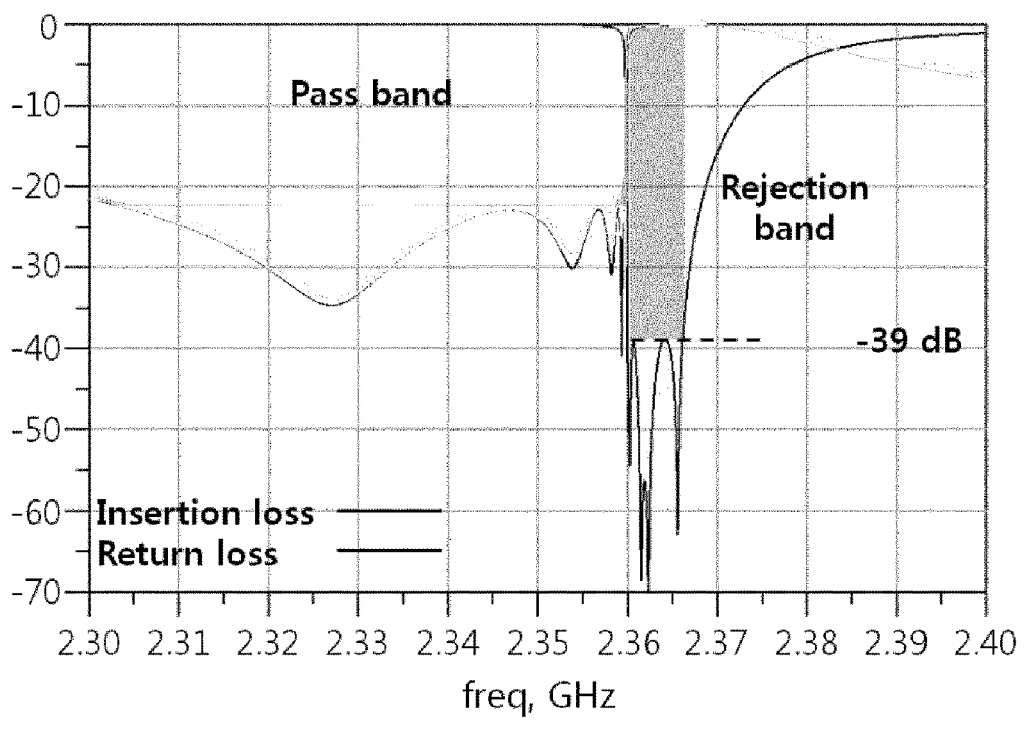
FIG. 17d is a view showing S-parameter properties of the band pass filter according to FIG. 17c.

FIG. 17d is a view showing S-parameter properties of the band pass filter according to FIG. 17b.

As illustrated, as in the form of another embodiment of the present invention, by using two dielectric resonators 300 provided with a compensation block, it can be seen that six transmission zeros and six reflection zeros are formed.

By applying the NRN stub 500 to the two dielectric resonators 300, improved properties over a typical band pass filter are exhibited, a stable structure is secured, and an excellent advantage in size is obtained.

In addition, it can be seen that a guard band of 500 kHz is formed between the pass band and the adjacent band. The level of high rejection, such as in the structure of one embodiment and other embodiments of the present invention, may be achieved by the structure of the NRN stub 500 coupled to each of the two dielectric resonators 300. That is, lowering from −19 dB to −39 dB to further improve the level value to secure a high rejection level, as in the structure of yet another embodiment of the present invention for preventing interference between two adjacent bands, may be secured by the plurality of dielectric resonators 300 and the NRN stub 500 coupled thereto.

Description of Symbols

10: Housing 20: Cavity
30: Resonator circuit 40: λ/4 transmission line
45: Coupling stub
100: Input terminal 200: Output terminal
300, 301: Dielectric resonator 310: Dielectric support
350: Compensation block
351: First compensation block 352: Second compensation block
353: Third compensation block 354: Fourth compensation block
400: λ/4 transmission line
410: First λ/4 transmission line 420: Second λ/4 transmission line
430: Third λ/4 transmission line 440: Fourth λ/4 transmission line
500, 510, 520, 530: NRN Stub
600, 610, 620, 630: Coupling stub

Industrial Applicability

The triple-mode dielectric resonator filter, the method for manufacturing the same, and the band pass filter using a dielectric resonator and an NRN stub according to the present invention may all be used in a resonator circuit and a filter circuit which may be miniaturized and light-weighted to pass a predetermined frequency band of a high-frequency signal that may be utilized in a wireless communication device including a high-frequency circuit such as a high-frequency wave and a millimeter wave or to block the frequency band.

The invention claimed is:

1. A triple-mode dielectric resonator filter, comprising:
a housing having one side thereof open while having a cavity thereinside;
a cover coupled to one side of the housing to seal the cavity;
a dielectric resonator having a screw mounting hole at the center thereof, positioned in the cavity of the housing, and formed perpendicular to a longitudinal direction of the housing;
a dielectric support coupled to the dielectric resonator through a thermosetting bonding process and mounted by a fixing screw passing through the screw mounting hole inside the cavity of the housing and fixed to support the dielectric resonator at a predetermined height; and
a plurality of compensation blocks formed to protrude at regular intervals on a side surface of the dielectric resonator to allow the dielectric resonator to operate in three modes,
wherein the plurality of compensation blocks for allowing the dielectric resonator to operate in three modes are formed to be paired with each other such that a horizontal cross-section of the dielectric resonator has a symmetric shape,
wherein a plurality of compensation blocks are configured such that compensation blocks adjacent to each other on a side surface of the dielectric resonator are smoothly connected to a curved surface having a cross-section in an arc shape,
wherein a height of the dielectric resonator and a length between the plurality of compensation blocks facing each other based on the horizontal cross-section of the dielectric resonator are adjusted to an optimized state to set resonant frequencies operating in three modes.

2. The triple-mode dielectric resonator filter of claim 1, wherein when the height of the dielectric resonator is relatively less than the length between the plurality of compensation blocks facing each other based on the horizontal cross-section of the dielectric resonator, resonant frequencies of TE01δx and TE01δy modes are lower than a resonant frequency of TE01δz mode in resonant frequencies operating in three modes.

3. The triple-mode dielectric resonator filter of claim 1, wherein when the height of the dielectric resonator is the same as the length between the plurality of compensation blocks facing each other based on the horizontal cross-section of the dielectric resonator, resonant frequencies of TE01δx and TE01δy modes are similar to a resonant frequency of TE01δz mode in resonant frequencies operating in three modes.

4. The triple-mode dielectric resonator filter of claim 1, wherein the dielectric support coupled to the dielectric resonator through a thermosetting bonding process is coupled thereto with a bonding material made of an epoxy material.

5. The triple-mode dielectric resonator filter of claim 1, wherein when the height of the dielectric resonator is relatively greater than the length between the plurality of compensation blocks facing each other based on the horizontal cross-section of the dielectric resonator, resonant frequencies of TE01δx and TE01δy modes are higher than a resonant frequency of TE01δz mode in resonant frequencies operating in three modes.

6. A band pass filter using a dielectric resonator and an NRN stub, the filter comprising:
a housing and a cover, wherein the housing is formed to have one side thereof open while having a cavity thereinside and the cover is coupled to one side of the housing to seal the cavity;
a dielectric resonator formed in a central portion of the cavity inside the housing and operating at resonant frequencies in three modes of TE01δx, TE01δy, and TE01δz;
a dielectric support for supporting the dielectric resonator formed in a cylindrical shape;
a λ/4 transmission line formed along the outside of the cavity while surrounding the dielectric resonator;
the NRN stub connected to the λ/4 transmission line and capable of obtaining the same number of transmission zeros and reflection zeros as the number of modes of the dielectric resonator; and
a coupling stub connected to the λ/4 transmission line and formed around the dielectric resonator to mutually couple the dielectric resonator and the NRN stub.

7. The band pass filter of claim 6, wherein the dielectric resonator has a screw mounting hole in the center thereof, positioned in the central portion of the cavity of the housing, and formed perpendicular to a longitudinal direction of the housing.

8. The band pass filter of claim 6, wherein the NRN stub is formed in plurality in each of TE01δx, TE01δy, and TE01δz modes and formed along the outside of the transmission line.

9. The band pass filter of claim 8, wherein each of the NRN stubs formed in each of TE01δx, TE01δy, and TE01δz modes has an end thereof formed as a short circuit line.

10. The band pass filter of claim 6, wherein the NRN stub is an inductive NRN stub acting as an inductor, and the reactance of the stub is adjusted using a length and width of the inductive NRN stub.

11. The band pass filter of claim 6, wherein the coupling stub is formed in each of TE01δx, TE01δy, and TE01δz modes which respectively correspond to the triple-mode dielectric resonator operating in TE01δx, TE01δy, and TE01δz modes and the NRN stub formed in each of TE01δx, TE01δy, and TE01δz modes.

12. The band pass filter of claim 11, wherein a length of the coupling stub disposed between the dielectric resonator and the NRN stub in each of TE01δx, TE01δy, and TE01δz modes is increased to widen the intervals between the reflection zeros, thereby forming a wide passband.

13. The band pass filter of claim 11, wherein each of the coupling stubs in each of TE01δx, TE01δy, and TE01δz formed corresponding to the plurality of NRN stubs in each of TE01δx, TE01δy, and TE01δz modes has an end thereof formed as an open line.

14. The band pass filter of claim 11, wherein the coupling stubs in each of TE01δx, TE01δy, and TE01δz are arranged to have the same field orientation and a perpendicular coupling structure to minimize parasitic coupling occurring between each mode and each coupling structure.

15. The band pass filter of claim 11, wherein the coupling stub of TE01δx mode and the coupling stub of TE01δy mode are arranged to be perpendicular to each other, and the coupling stub of TE01δz mode is disposed to be mutually perpendicular to the coupling stub of TE01δx and the coupling stub of TE01δy to minimize the parasite coupling structure with the resonator in TE01δx and TE01δy modes.

16. The band pass filter of claim 11, wherein a length of the coupling stub for the TE01δx mode and a length of the coupling stub for the TE01δy mode are varied in a z-axis direction, and a length of the coupling stub for the TE01δz mode is varied along the direction of the circumference of the dielectric resonator.

17. A band pass filter using a dielectric resonator and an NRN stub, the filter comprising:
 a housing and a cover, wherein the housing is formed to have one side thereof open while having a cavity thereinside and the cover is coupled to one side of the housing to seal the cavity;
 a dielectric resonator formed in a central portion of the cavity inside the housing and operating at triple-mode resonant frequencies of TE01δx, TE01δy, and TE01δz;
 a dielectric support having compensation blocks formed to protrude at regular intervals on a surface of the dielectric resonator and supporting the dielectric resonator;
 a λ/4 transmission line formed along the outside of the cavity while surrounding the dielectric resonator;
 the NRN stub connected to the λ/4 transmission line and capable of obtaining the same number of transmission zeros and reflection zeros as the number of modes of the dielectric resonator; and
 a coupling stub connected to the λ/4 transmission line and formed around the dielectric resonator to mutually couple the dielectric resonator and the NRN stub.

18. The band pass filter of claim 17, wherein the dielectric resonator has a screw mounting hole in the center thereof, positioned in the central portion of the cavity of the housing, and formed perpendicular to a longitudinal direction of the housing.

19. The band pass filter of claim 17, wherein the NRN stub is formed in plurality in each of TE01δx, TE01δy, and TE01δz modes and formed along the outside of the transmission line.

20. The band pass filter of claim 19, wherein each of the NRN stubs formed in each of TE01δx, TE01δy, and TE01δz modes has an end thereof formed as a short circuit line.

21. The band pass filter of claim 17, wherein the NRN stub is an inductive NRN stub acting as an inductor, and the reactance of the stub is adjusted using a length and width of the inductive NRN stub.

22. The band pass filter of claim 17, wherein the coupling stub is formed in each of TE01δx, TE01δy, and TE01δz modes which respectively correspond to the triple-mode dielectric resonator operating in TE01δx, TE01δy, and TE01δz modes and the NRN stub formed in each of TE01δx, TE01δy, and TE01δz modes.

* * * * *